(12) United States Patent
Tominaga et al.

(10) Patent No.: US 11,444,193 B2
(45) Date of Patent: Sep. 13, 2022

(54) SILICON CARBIDE SEMICONDUCTOR DEVICE

(71) Applicant: Mitsubishi Electric Corporation, Tokyo (JP)

(72) Inventors: Takaaki Tominaga, Tokyo (JP); Yutaka Fukui, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/956,611

(22) PCT Filed: Feb. 19, 2018

(86) PCT No.: PCT/JP2018/005688
§ 371 (c)(1),
(2) Date: Jun. 30, 2020

(87) PCT Pub. No.: WO2019/159350
PCT Pub. Date: Aug. 22, 2019

(65) Prior Publication Data
US 2021/0098620 A1    Apr. 1, 2021

(51) Int. Cl.
*H01L 29/78* (2006.01)
*H01L 29/06* (2006.01)
*H01L 29/16* (2006.01)

(52) U.S. Cl.
CPC ...... *H01L 29/7813* (2013.01); *H01L 29/0615* (2013.01); *H01L 29/1608* (2013.01)

(58) Field of Classification Search
CPC ............. H01L 29/7813; H01L 29/0623; H01L 29/1608; H01L 29/0696
See application file for complete search history.

(56) References Cited

U.S. PATENT DOCUMENTS

2011/0278599 A1    11/2011   Nakao et al.
2012/0061688 A1     3/2012   Watanabe et al.
(Continued)

FOREIGN PATENT DOCUMENTS

JP    2004-273647 A    9/2004
JP    2014-135367 A    7/2014
(Continued)

OTHER PUBLICATIONS

International Search Report and Written Opinion dated Apr. 24, 2018 for PCT/JP2018/005688 filed on Feb. 19, 2018, 11 pages including English Translation of the International Search Report.
(Continued)

*Primary Examiner* — Samuel A Gebremariam
*Assistant Examiner* — Jonas T Beardsley
(74) *Attorney, Agent, or Firm* — Xsensus LLP

(57) ABSTRACT

A drift layer and a source region have a first conductivity type. A base region has a second conductivity type. A first trench penetrates the source region and the base region. A gate electrode is provided in the first trench through a gate insulation film. A first relaxation region is disposed below the first trench, and has the second conductivity type. A source pad electrode is electrically connected to the first relaxation region. A gate pad electrode is disposed in a non-element region. An impurity region is disposed in the non-element region, is provided on the drift layer, and has the first conductivity type. A second trench penetrates the impurity region. A second relaxation region is disposed below the second trench, and has the second conductivity type.

9 Claims, 22 Drawing Sheets

(56) References Cited

U.S. PATENT DOCUMENTS

| | | | |
|---|---|---|---|
| 2013/0285140 A1 | 10/2013 | Kagawa et al. | |
| 2013/0306983 A1* | 11/2013 | Nakano | H01L 29/1608 |
| | | | 257/76 |
| 2014/0191248 A1 | 7/2014 | Takaya et al. | |
| 2016/0071922 A1 | 3/2016 | Kagawa et al. | |
| 2017/0012121 A1* | 1/2017 | Saito | H01L 29/7811 |
| 2017/0162649 A1 | 6/2017 | Kagawa et al. | |
| 2020/0243641 A1* | 7/2020 | Nakagawa | H01L 29/42376 |

FOREIGN PATENT DOCUMENTS

| | | |
|---|---|---|
| JP | 2015-211159 A | 11/2015 |
| WO | 2010/098294 A1 | 9/2010 |
| WO | 2011/007387 A1 | 1/2011 |
| WO | 2012/077617 A1 | 6/2012 |
| WO | 2015/098168 A1 | 7/2015 |
| WO | 2018/038133 A1 | 3/2018 |

OTHER PUBLICATIONS

International Search Report and Written Opinion dated Apr. 24, 2018 for PCT/JP2018/005693 filed on Feb. 19, 2018, 9 pages including English Translation of the International Search Report.

* cited by examiner

F I G. 1
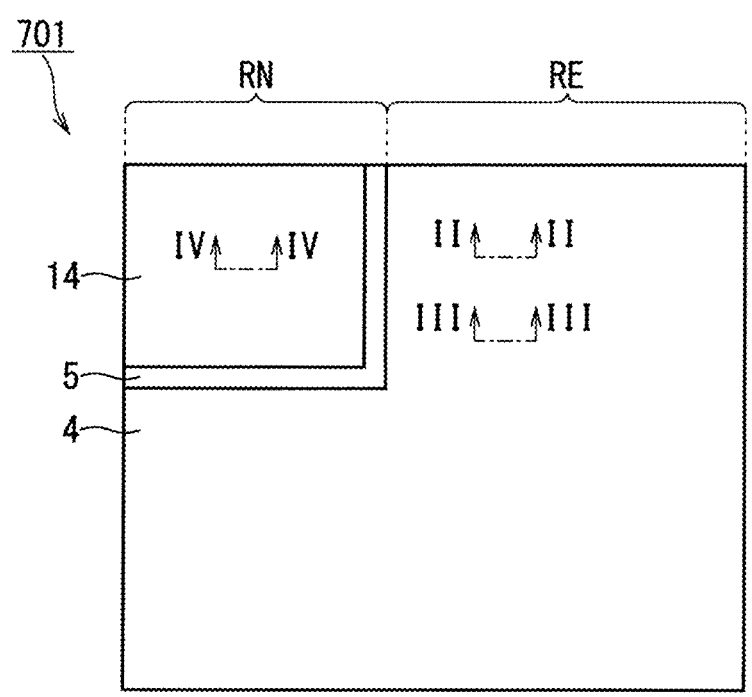

F I G. 3
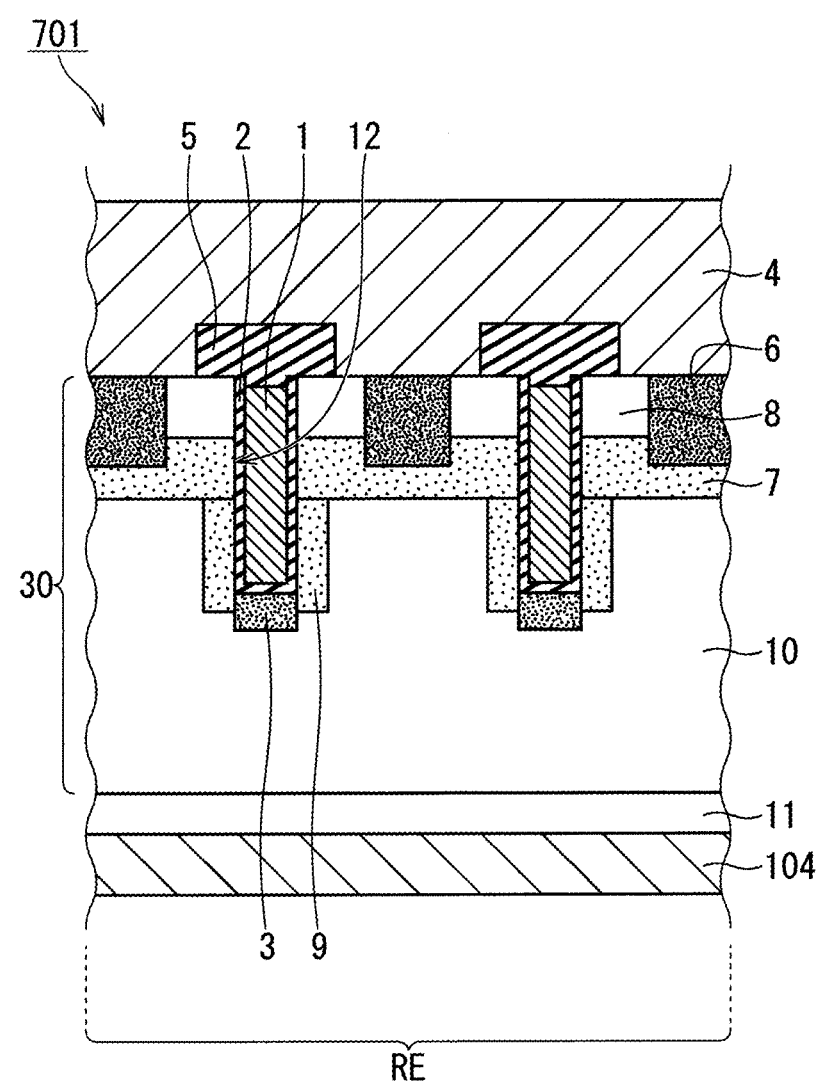

F I G. 4
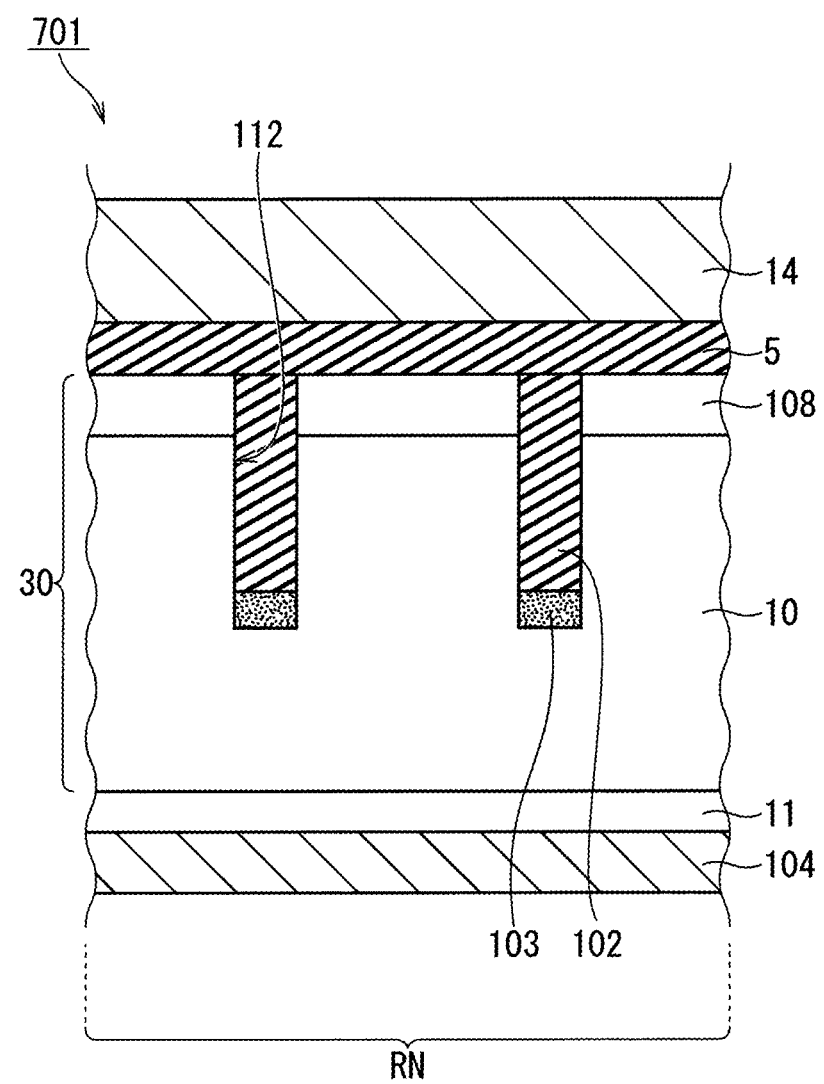

F I G. 5
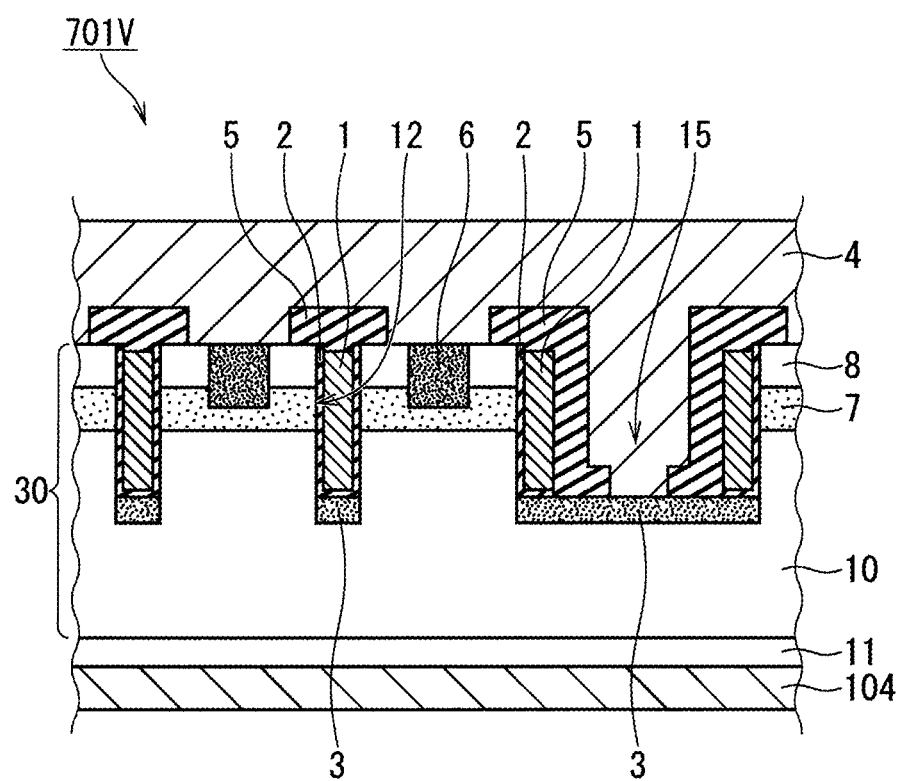

F I G. 8
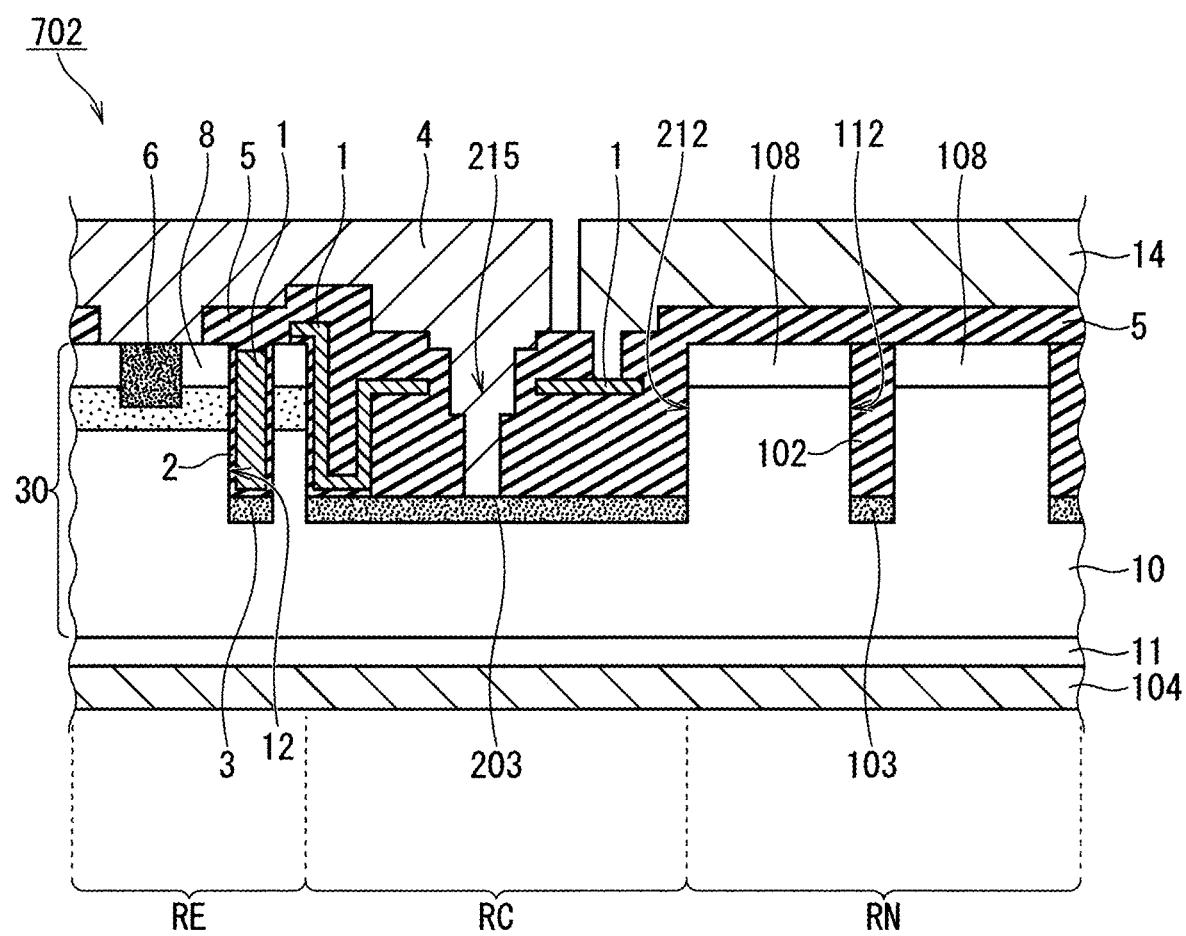

F I G. 9
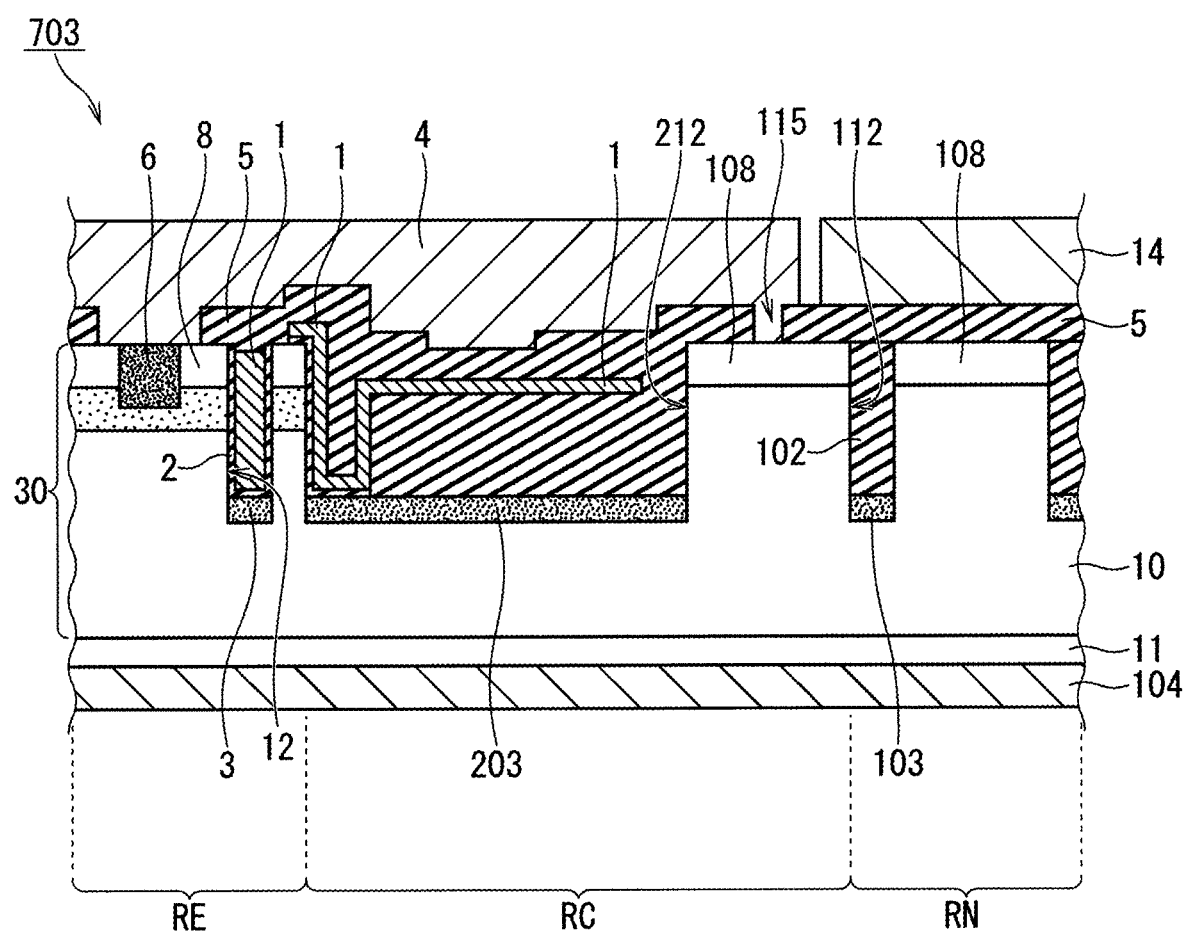

F I G. 1 1
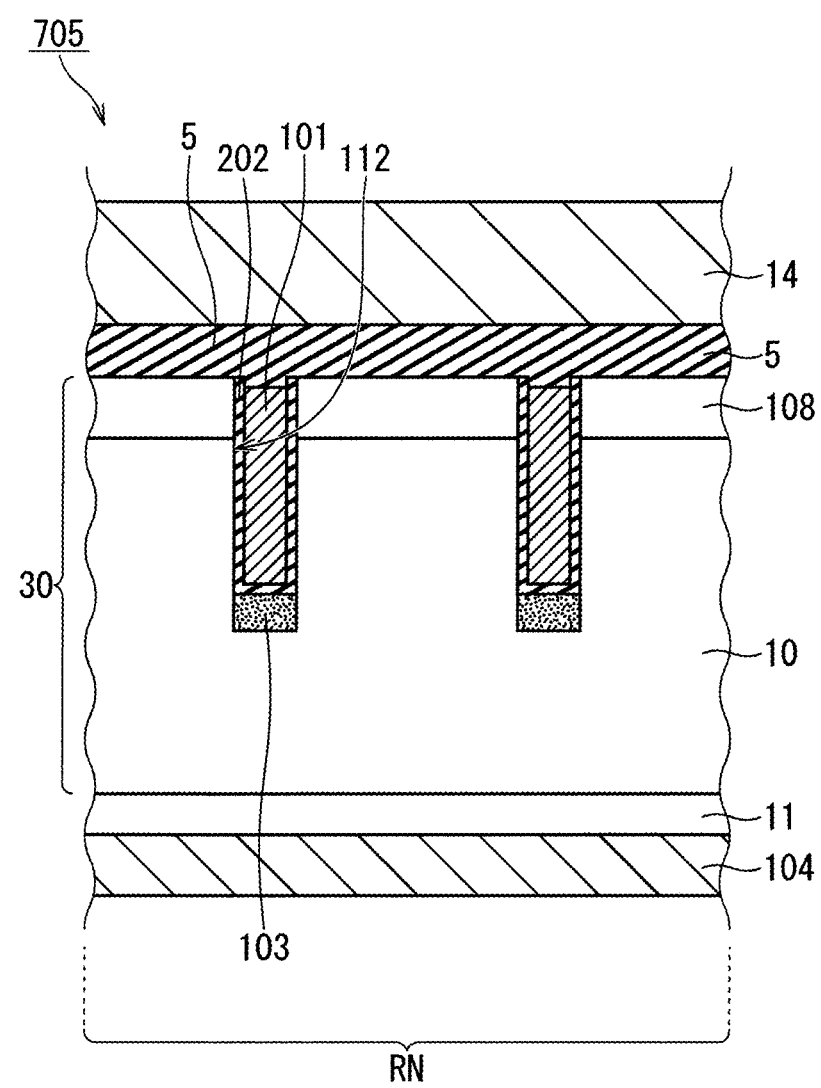

F I G. 1 4
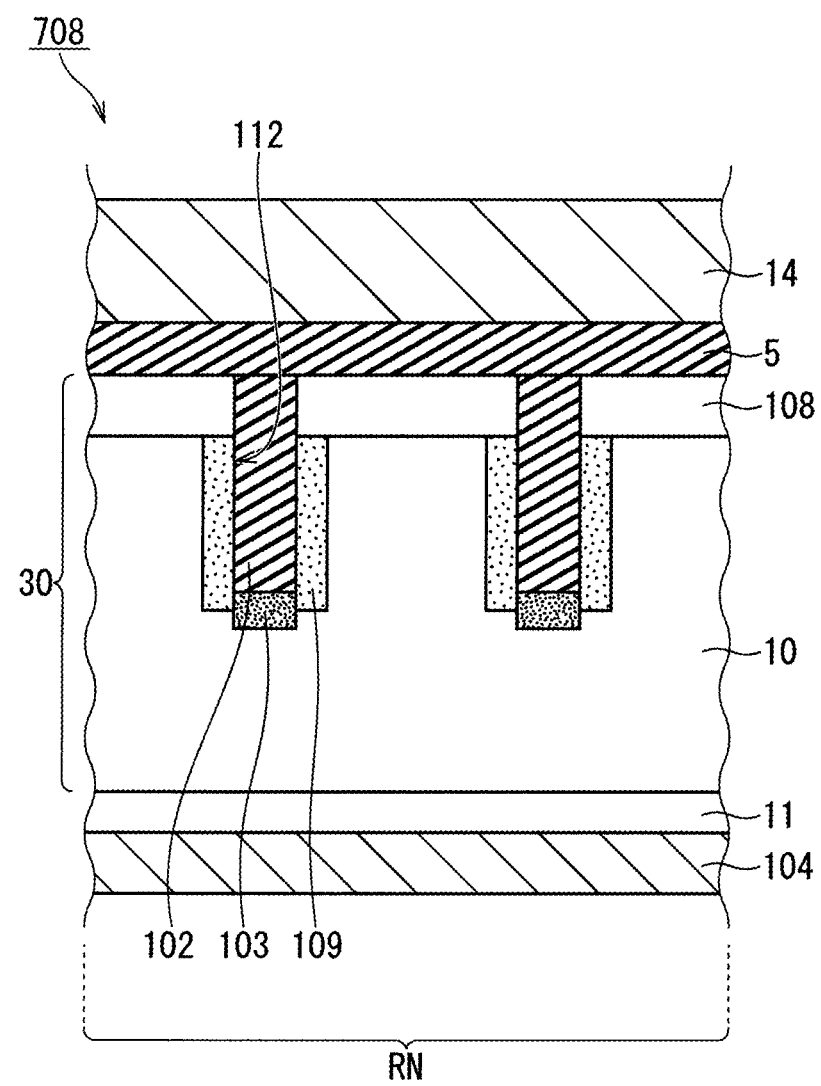

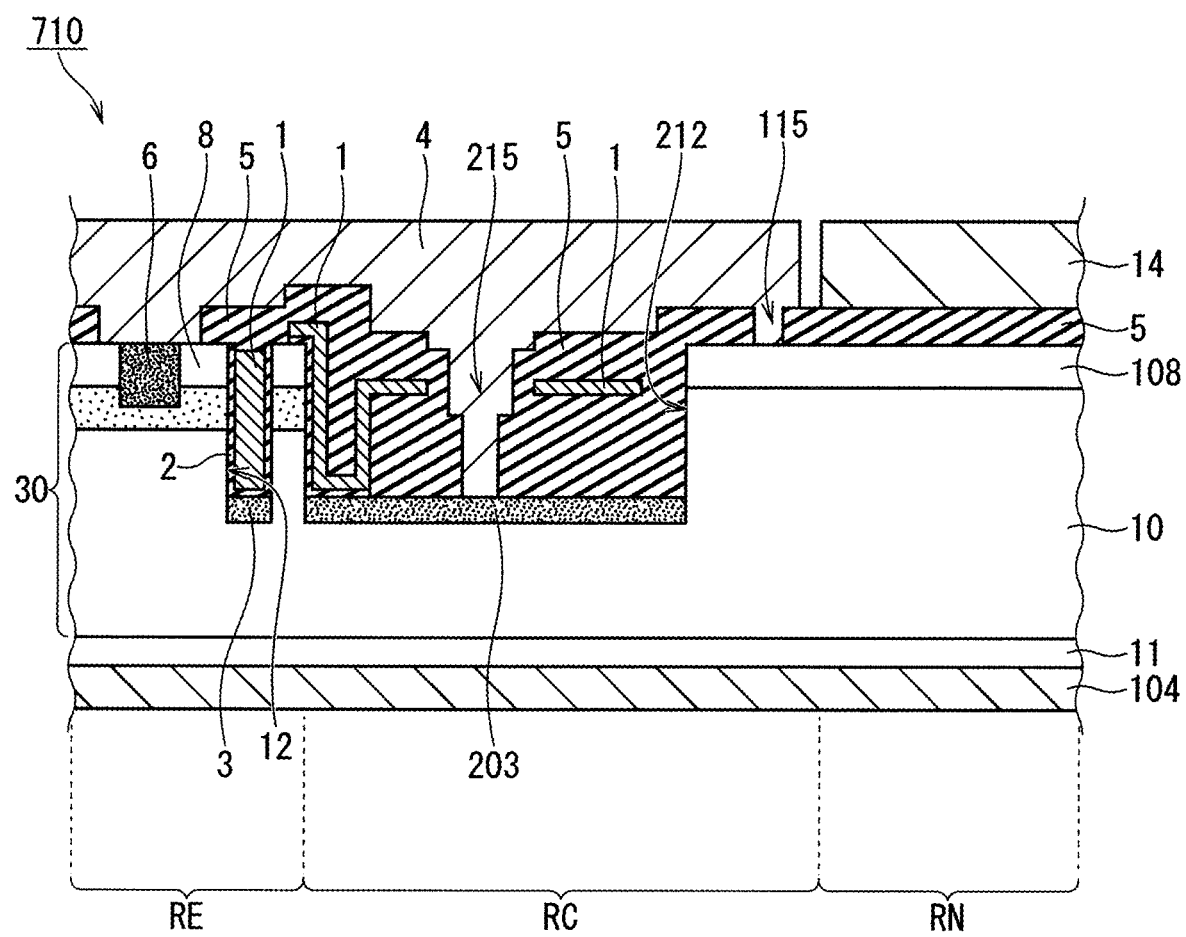
F I G. 1 7

F I G. 2 1
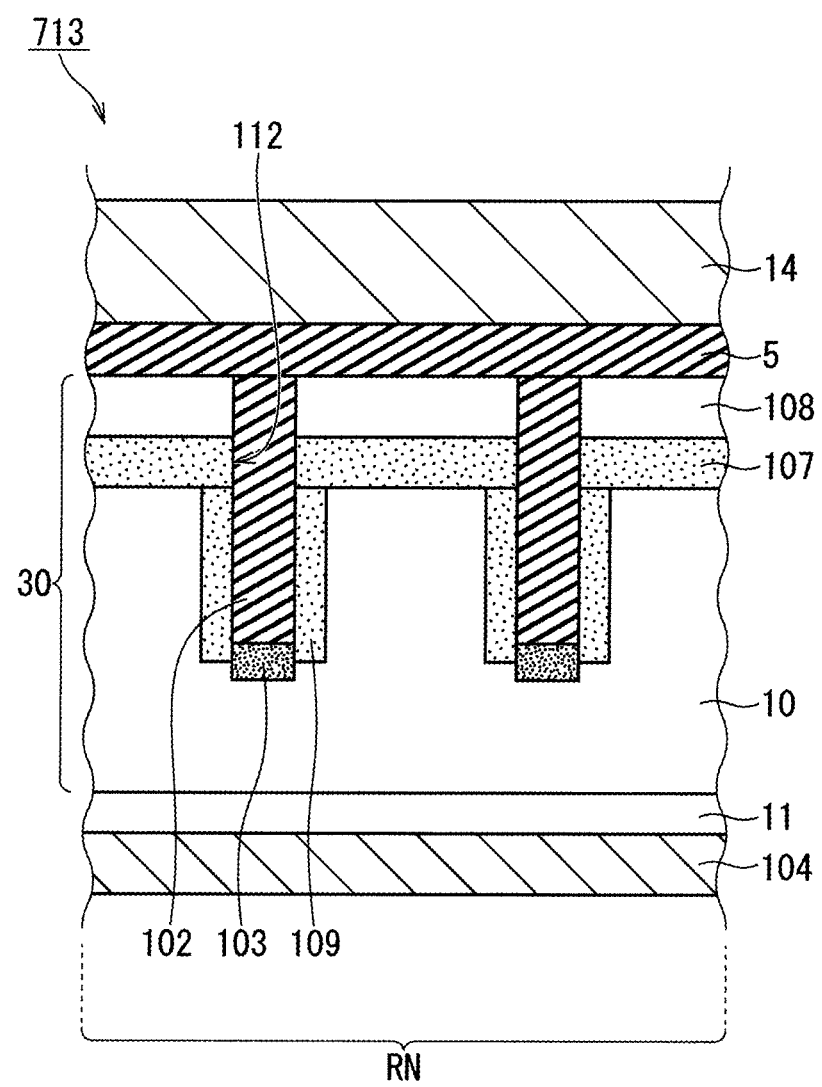

SILICON CARBIDE SEMICONDUCTOR DEVICE

CROSS-REFERENCE TO RELATED APPLICATIONS

The present application is based on PCT filing PCT/JP2018/005688, filed Feb. 19, 2018, the entire contents of which are incorporated herein by reference. The present application is also related to co-pending U.S. application Ser. No. 16/956,613, entitled SILICON CARBIDE SEMICONDUCTOR DEVICE, which is based on PCT/JP2018/005693, filed Feb. 19, 2018, the entire contents of which are incorporated herein by reference.

TECHNICAL FIELD

The present invention relates to a silicon carbide semiconductor device.

BACKGROUND ART

As a switching element used in an inverter circuit or the like, a vertical power semiconductor device is widely used, and particularly a vertical power semiconductor device having a metal-oxide-semiconductor (MOS) structure is widely used. Typically, an insulated gate bipolar transistor (IGBT) and a metal-oxide-semiconductor field-effect transistor (MOSFET) are used. For example, WO 2010/098294 (Patent Document 1) discloses a MOSFET, and Japanese Patent Application Laid-Open No. 2004-273647 (Patent Document 2) discloses an IGBT. Patent Document 1 particularly discloses a vertical n-channel MOSFET that uses silicon carbide (SiC) as a semiconductor material. Further, WO 2012/077617 (Patent Document 3) discloses a trench-gate MOSFET, with the aim of further reducing an on-voltage of a vertical n-channel MOSFET using silicon carbide.

The n-channel MOSFET includes an n-type drift layer, and a p-type well provided on the n-type drift layer. When the MOSFET is switched from an on state to an off state, a drain voltage of the MOSFET, i.e., a voltage of a drain electrode, drastically increases from nearly zero volts to several hundreds of volts. In this case, a displacement current is generated through parasitic capacitance present between the p-type well and the n-type drift layer. A displacement current generated on the drain electrode side flows to the drain electrode, and a displacement current generated on the source electrode side flows to the source electrode through the p-type well.

Here, in the vertical n-channel MOSFET, typically, other p-type wells are provided in an outer peripheral region of a chip in addition to the p-type well constituting a MOSFET cell that actually functions as the MOSFET. Examples of such other p-type wells include one positioned immediately below a gate pad. These p-type wells in the outer peripheral region usually have a significantly larger cross-sectional area in the horizontal plane (area in the plane layout) than the p-type well in the MOSFET cell. Accordingly, in the p-type wells in the outer peripheral region, the above-mentioned displacement current needs to flow in a long path to reach the source electrode. The p-type wells thus have high electric resistance as a current path for the displacement current. As a result, intolerably large potential drop may occur in the p-type wells. Thus, in the p-type wells, a relatively large potential difference with respect to a source potential is generated at a position that is far from a position connected to the source electrode in the in-plane direction. This may raise concern about occurrence of dielectric breakdown due to the potential difference.

In recent years, a semiconductor device that uses silicon carbide having a bandgap approximately three times as large as a bandgap of silicon, the most general semiconductor material, has been started to be used as a switching element of an inverter circuit, and particularly an n-channel MOSFET has been put into use. The use of a semiconductor having a wide bandgap allows for reduction of losses of an inverter circuit. To further reduce losses, it is required to drive a switching element at higher speed. In other words, to reduce losses, it is required to further increase dV/dt, which represents variation of a drain voltage V with respect to time t. In such a case, the displacement current that flows into the p-type well through parasitic capacitance is also increased. In addition, it is more difficult to perform treatment of reducing electric resistance by means of doping on silicon carbide than silicon. Thus, when silicon carbide is used, the p-type well is liable to have large parasitic resistance. Such large parasitic resistance may easily lead to large potential drop in the p-type well. Under the circumstances as described above, the use of silicon carbide may raise greater concern about the above-mentioned dielectric breakdown.

In the technology of WO 2010/098294 described above, a low-resistance p-type semiconductor layer is provided on the entire or partial upper surface of the p-type well that is positioned below the gate pad in the outer peripheral region. This allows for reduction of voltage distribution in the p-type well due to potential drop occurring when a displacement current flows in the p-type well positioned below the gate pad. Consequently, a potential difference between the p-type well and the gate electrode is reduced. Consequently, a breakdown of a gate insulation film is reduced.

In contrast, in the technology of WO 2011/007387 (Patent Document 4), a low-resistance n-type semiconductor layer is provided on the entire or partial upper surface of the p-type well that is positioned below the gate pad in the outer peripheral region. This allows for further reduction of voltage distribution in the p-type well due to potential drop occurring when a displacement current flows in the p-type well positioned below the gate pad, as compared to the case where a low-resistance p-type semiconductor layer is provided. This reduces a potential difference between the p-type well and the gate electrode. Consequently, a breakdown of a gate insulation film is reduced.

PRIOR ART DOCUMENTS

Patent Documents

Patent Document 1: WO 2010/098294
Patent Document 2: Japanese Patent Application Laid-Open No. 2004-273647
Patent Document 3: WO 2012/077617
Patent Document 4: WO 2011/007387

SUMMARY

Problem to be Solved by the Invention

A planar MOSFET and a trench MOSFET usually have different configurations of their outer peripheral regions (in a more general term, "non-element regions"). The technologies of WO 2010/098294 and WO 2011/007387 described above relate to a planar MOSFET, and are thus not necessarily appropriate for the trench type.

The present invention is made in order to solve the problems as described above, and has an object to provide a trench silicon carbide semiconductor device that is capable of reducing element breakdown at the time of switching by reducing potential drop occurring when a displacement current flows.

Means to Solve the Problem

A silicon carbide semiconductor device according to the present invention is a silicon carbide semiconductor device including an element region and a non-element region being provided outside the element region in plan view. The silicon carbide semiconductor device includes a silicon carbide semiconductor substrate, a drift layer, a base region, a source region, a first trench, a gate insulation film, a gate electrode, a first relaxation region, a source pad electrode, a gate pad electrode, at least one impurity region, at least one second trench, and at least one second relaxation region. The silicon carbide semiconductor substrate extends across the element region and the non-element region. The drift layer is provided on the silicon carbide semiconductor substrate, is made of silicon carbide, and has a first conductivity type. The base region is disposed in the element region, is provided on the drift layer, and has a second conductivity type different from the first conductivity type. The source region is disposed in the element region, is provided on the base region, and has the first conductivity type. The first trench has a side surface penetrating the source region and the base region, and a bottom surface. The gate insulation film is provided on the side surface and on the bottom surface of the first trench. The gate electrode is provided in the first trench through the gate insulation film. The first relaxation region is disposed below the first trench, is in contact with the drift layer, and has the second conductivity type. The source pad electrode is electrically connected to the source region and the first relaxation region. The gate pad electrode is disposed in the non-element region, and is electrically connected to the gate electrode. The impurity region is disposed in at least the non-element region, is provided on the drift layer, and has the first conductivity type. The second trench has a side surface penetrating the impurity region, and a bottom surface. The second relaxation region is disposed below the second trench, is in contact with the drift layer, and has the second conductivity type.

Effects of the Invention

According to the present invention, at the time of high-speed switching of the silicon carbide semiconductor device, the impurity region on the drift layer is included as a part of a path for a displacement current passing through the second relaxation region in the non-element region. This reduces effective sheet resistance for the displacement current. Consequently, the magnitude of potential drop due to the displacement current is reduced. Consequently, the magnitude of a voltage between a potential of the second relaxation region and a gate potential due to the potential drop is reduced. Consequently, dielectric breakdown between the second relaxation region and a region including the gate potential is reduced.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a plan view schematically illustrating a configuration of a silicon carbide device according to the first embodiment of the present invention.

FIG. 3 is a schematic partial cross-sectional view taken along the line of FIG. 1.

FIG. 4 is a schematic partial cross-sectional view taken along the line IV-IV of FIG. 1.

FIG. 5 is a partial cross-sectional view schematically illustrating a configuration of a silicon carbide device according to a modification of the first embodiment of the present invention, taken along the line V-V of FIG. 6.

FIG. 8 is a schematic partial cross-sectional view taken along the line VIII-VIII of FIG. 7.

FIG. 9 is a partial cross-sectional view of a configuration of a silicon carbide device according to the third embodiment of the present invention, which is illustrated in a cross-section similar to that taken along the line VIII-VIII of FIG. 7.

FIG. 11 is a partial cross-sectional view illustrating a configuration of a silicon carbide device according to the fifth embodiment of the present invention in a non-element region.

FIG. 14 is a partial cross-sectional view illustrating a configuration of a silicon carbide device according to the eighth embodiment of the present invention in a non-element region.

FIG. 17 is a partial cross-sectional view taken along the line XVII-XVII of FIG. 16.

FIG. 21 is a partial cross-sectional view illustrating a configuration of a silicon carbide device according to the thirteenth embodiment of the present invention in a non-element region.

DESCRIPTION OF EMBODIMENTS

Embodiments of the present invention will be described below with reference to the drawings. Note that, in the following drawings, the same or equivalent parts will be denoted by the same reference signs, and description thereof will not be repeated.

First Embodiment (Configuration)

FIG. 1 is a plan view schematically illustrating a configuration of a MOSFET 701 (silicon carbide semiconductor device) according to the first embodiment. The MOSFET 701 includes, in plan view, an element region RE and a non-element region RN. The element region RE includes a region in which channels controlled by gate electrodes are disposed, and typically is a region in which a MOSFET cell that actually functions as a MOSFET is disposed. The non-element region RN is provided outside the element region RE, and includes a region in which a gate pad electrode 14 for supplying the gate electrode with a desired voltage from the outside is disposed. A wire made of metal such as aluminum is connected to the gate pad electrode 14 by means of ultrasonic joining or the like. The non-element region RN may include a termination region of the MOSFET 701.

Figure 2:
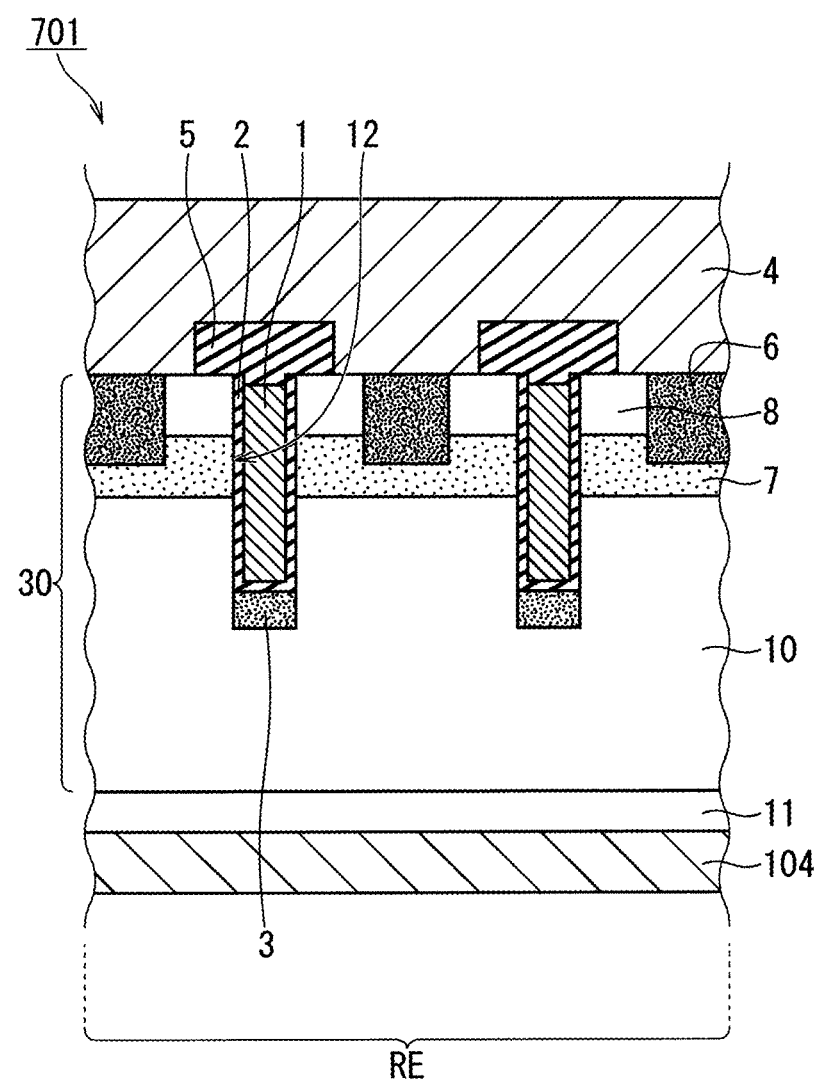
FIG. 2 is a schematic partial cross-sectional view taken along the line II-II of FIG. 1.

FIG. 2 and FIG. 3 schematically illustrate different partial cross-sections in the element region RE taken along the line II-II and the line of FIG. 1, respectively. FIG. 4 schematically illustrates a partial cross-section in the non-element region RN taken along the line IV-IV of FIG. 1. Note that, in these cross-sectional diagrams and other cross-sectional diagrams to be described later, regions having a p type (second conductivity type) are dotted.

The MOSFET 701 includes a substrate 11 (a silicon carbide semiconductor substrate), an epitaxial layer 30 (a silicon carbide semiconductor layer), a gate insulation film 2, a gate electrode 1, a gate pad electrode 14, a source pad electrode 4, a drain electrode 104, an inter-layer insulation film 5, and an insulator region 102. The epitaxial layer 30 includes a drift layer 10, a base region 7, a source region 8, an impurity region 108, a high-concentration region 6, a first relaxation region 3, a second relaxation region 103, and a connection region 9. In the epitaxial layer 30, a first trench 12 (FIG. 2 and FIG. 3) and a second trench 112 (FIG. 4) are provided.

The substrate 11 extends across the element region RE and the non-element region RN. The substrate 11 has an n type (first conductivity type). The epitaxial layer 30 is provided by means of epitaxial growth on the substrate 11, and extends across the element region RE and the non-element region RN.

The drift layer 10 is provided on the substrate 11 so as to extend across the element region RE and the non-element region RN. The drift layer 10 is made of silicon carbide. The drift layer 10 has the n type, and has donor concentration of $1 \times 10^{14}$ cm$^{-3}$ to $1 \times 10^{17}$ cm$^{-3}$. It is preferable that the donor concentration of the drift layer 10 be lower than donor concentration of the substrate 11.

The base region 7 is disposed in the element region RE, and is provided on the drift layer 10. The base region 7 has a p type (second conductivity type different from the first conductivity type), and preferably has acceptor concentration of $1 \times 10^{14}$ cm$^{-3}$ to $1 \times 10^{18}$ cm$^{-3}$. Note that the acceptor concentration and thickness of the base region 7 need not be uniform. The source region 8 is disposed in the element region RE, and is provided on the base region 7. The source region 8 has the n type, has donor concentration higher than the donor concentration of the drift layer 10, and specifically has donor concentration of $1 \times 10^{18}$ cm$^{-3}$ to $1 \times 10^{20}$ cm$^{-3}$. The high-concentration region 6 is disposed in the element region RE, and penetrates the source region 8 to reach the base region 7. The high-concentration region 6 has the p type, has acceptor concentration higher than the acceptor concentration of the base region 7, and specifically has acceptor concentration of $1 \times 10^{19}$ cm$^{-3}$ to $1 \times 10^{21}$ cm$^{-3}$.

In the present embodiment, as illustrated in FIG. 2, a plurality of first trenches 12 are disposed in the element region RE at intervals. Note that the plurality of first trenches 12 in a certain cross-section, such as those illustrated in FIG. 2, may be connected to one another in the plane layout. The first trench 12 has a side surface and a bottom surface. The side surface of the first trench 12 penetrates the source region 8 and the base region 7. The side surface of the first trench 12 reaches the drift layer 10 in the cross-section of FIG. 2. In this manner, channels of the MOSFET are configured in the cross-section of FIG. 2. The first relaxation region 3 is disposed below the first trench 12, and is in contact with the drift layer 10. Typically, the first relaxation region 3 is in contact with the bottom surface of the first trench 12. The first relaxation region 3 has the p type, and preferably has acceptor concentration of $1 \times 10^{14}$ cm$^{-3}$ to $1 \times 10^{18}$ cm$^{-3}$. Note that the acceptor concentration and thickness of the first relaxation region 3 need not be uniform. The gate insulation film 2 is provided on the side surface and on the bottom surface of the first trench 12. At least a part of the gate electrode 1 is provided in the first trench 12 through the gate insulation film 2.

The source pad electrode 4 is electrically connected to the source region 8 and the high-concentration region 6 by means of ohmic junction or Schottky junction. In order to achieve this electrical connection, the source pad electrode 4 is in contact with the source region 8 and the high-concentration region 6. Note that a part of the source pad electrode 4 to come in contact with the source region 8 and the high-concentration region 6 may be silicided. In other words, the source pad electrode 4 may include a silicide layer in contact with the source region 8 and the high-concentration region 6. The source pad electrode 4 is separated from the gate electrode 1 by the inter-layer insulation film 5.

The source pad electrode 4 is electrically connected to the first relaxation region 3. In the present embodiment, the source pad electrode 4 is connected to the first relaxation region 3 having the p type through only a semiconductor region having the p type. Specifically, as illustrated in FIG. 3, the source pad electrode 4 is connected to the first relaxation region 3 through the high-concentration region 6, the base region 7, and the connection region 9. In order to achieve such electrical connection, in a region between the base region 7 and the bottom surface of the first trench 12, the connection region 9 is provided adjacently to the side surface of the first trench 12. As described above, the connection region 9 has the p type, and preferably has acceptor concentration of $1 \times 10^{14}$ cm$^{-3}$ to $1 \times 10^{18}$ cm$^{-3}$. Note that the acceptor concentration and thickness of the connection region 9 need not be uniform. A plurality of connection regions 9 separated from one another in the plane layout may be provided. Further, although the connection region 9 is provided on both the sides of the first trench 12 in FIG. 3, the connection region 9 may be provided on only either side thereof. Further, disposition of one connection region 9 provided on one side of the first trench 12 and disposition of another connection region 9 provided on the other side of the first trench 12 may be different in the longitudinal direction of the first trench 12.

The gate pad electrode 14 is disposed in the non-element region RN, and is electrically connected to the gate electrode 1 by means of ohmic junction or Schottky junction. In order to achieve this electrical connection, for example, the gate electrode 1 includes a part that extends from the element region RE to the non-element region RN, and this extending part is in contact with the gate pad electrode 14 in the non-element region RN. In this manner, ohmic contact or Schottky contact is provided between the gate pad electrode 14 and the gate electrode 1.

The impurity region 108 is disposed in at least the non-element region RN, and is provided on the drift layer 10. The impurity region 108 has the n type, and has donor concentration higher than the donor concentration of the drift layer 10. Specifically, the donor concentration of the impurity region 108 is $1 \times 10^{18}$ cm$^{-3}$ to $1 \times 10^{20}$ cm$^{-3}$, and may be the same or different from the donor concentration of the source region 8. The impurity region 108 is separated from the gate pad electrode 14 by the inter-layer insulation film 5. Note that it is preferable that the impurity region 108 be electrically connected to the source pad electrode 4 in the present embodiment, but the impurity region 108 may be insulated from the source pad electrode 4. Further, it is preferable that the impurity region 108 be electrically connected to the first relaxation region 3, but the impurity region 108 may be insulated from the first relaxation region 3. Note that if the impurity region 108 is insulated from the source pad electrode 4, a displacement current that flows from the second relaxation region 103 to the impurity region 108 via the drift layer 10 may flow into any of the above-described electrodes via some capacitance, or may flow into the second relaxation region 103 again via pn junction capacitance.

The second trench 112 (FIG. 4) is disposed in the non-element region RN. The second trench 112 has a side surface and a bottom surface. The side surface of the second trench 112 penetrates the impurity region 108 to reach the drift layer 10. The second trench 112 may have depth the same as the depth of the first trench 12. In the present embodiment, as illustrated in FIG. 4, a plurality of second trenches 112 are disposed at intervals. Note that the plurality of second trenches 112 in a certain cross-section, such as those illustrated in FIG. 4, may be connected to one another in the plane layout.

The second relaxation region 103 is disposed below the second trench 112, and is in contact with the drift layer 10. Typically, the second relaxation region 103 is in contact with the bottom surface of the second trench 112. The second relaxation region 103 has the p type, and preferably has acceptor concentration of $1 \times 10^{14}$ cm$^{-3}$ to $1 \times 10^{18}$ cm$^{-3}$. Note that the acceptor concentration and thickness of the second relaxation region 103 need not be uniform. The second relaxation region 103 may have acceptor concentration the same as the acceptor concentration of the first relaxation region 3. Note that it is preferable that the second relaxation region 103 be electrically connected to the source pad electrode 4 in the present embodiment, but the second relaxation region 103 may be insulated from the source pad electrode 4. Further, it is preferable that the second relaxation region 103 be electrically connected to the first relaxation region 3, but the second relaxation region 103 may be insulated from the first relaxation region 3. Further, the second relaxation region 103 may be directly connected to the first relaxation region 3.

The insulator region 102 is provided in the second trench 112, and fills the second trench 112. In the present embodiment, the second trench 112 is filled only with an insulator. Materials of the insulator region 102 need not be uniform. For example, a part of the insulator region 102 that faces the side surface and the bottom surface of the second trench 112 is made of a material the same as a material of the gate insulation film 2 (FIG. 2), and another part of the insulator region 102 that fills the second trench 112 through the above-mentioned part is made of a material the same as a material of the inter-layer insulation film 5.

The drain electrode 104 is provided on a surface (lower surface of FIG. 2 to FIG. 4) of the substrate 11 opposite to a surface on which the drift layer 10 is provided. In this manner, the drain electrode 104 is electrically connected to the drift layer 10 having the n type through the substrate 11 having the n type. Specifically, at least one (two in the present embodiment) interface constituting ohmic junction or interface constituting Schottky junction is provided between the drain electrode 104 and the drift layer 10. Note that the junction part between the drain electrode 104 and the drift layer 10 may include a silicide.

Note that, in the present embodiment, the first conductivity type is an n type and the second conductivity type is a p type. However, as a modification, these conductivity types may be inverted. In such a case, the terms "donor concentration" and "acceptor concentration" used in the above description regarding impurity concentration shall be interchanged. Further, the plane layout illustrated in FIG. 1 is only illustrative, and any disposition may be adopted for the non-element region RN in the plane layout.

(Effects)

According to the present embodiment, at the time of high-speed switching of the MOSFET 701, the impurity region 108 on the drift layer 10 is included as a path for a displacement current passing through the second relaxation region 103 in the non-element region RN (FIG. 4). This reduces effective sheet resistance for the displacement current. Consequently, the magnitude of potential drop due to the displacement current is reduced. Consequently, the magnitude of a voltage between a potential of the second relaxation region 103 and a gate potential due to the potential drop is reduced. Consequently, dielectric breakdown between the second relaxation region 103 and a region including the gate potential, namely the gate pad electrode 14, is reduced.

Specifically, at the time of off-switching, a displacement current mainly flows due to a forward current in the pn junction between the second relaxation region 103 and the drift layer 10 in a direction from the second relaxation region 103 to the impurity region 108. At the time of on-switching, a displacement current mainly flows through the pn junction capacitance between the second relaxation region 103 and the drift layer 10 in a direction from the impurity region 108 to the second relaxation region 103. These displacement currents have low sheet resistance due to high impurity concentration of the impurity region 108, and such low sheet resistance allows the displacement currents to flow through the impurity region 108 with low potential drop.

(Modification)

Figure 6:
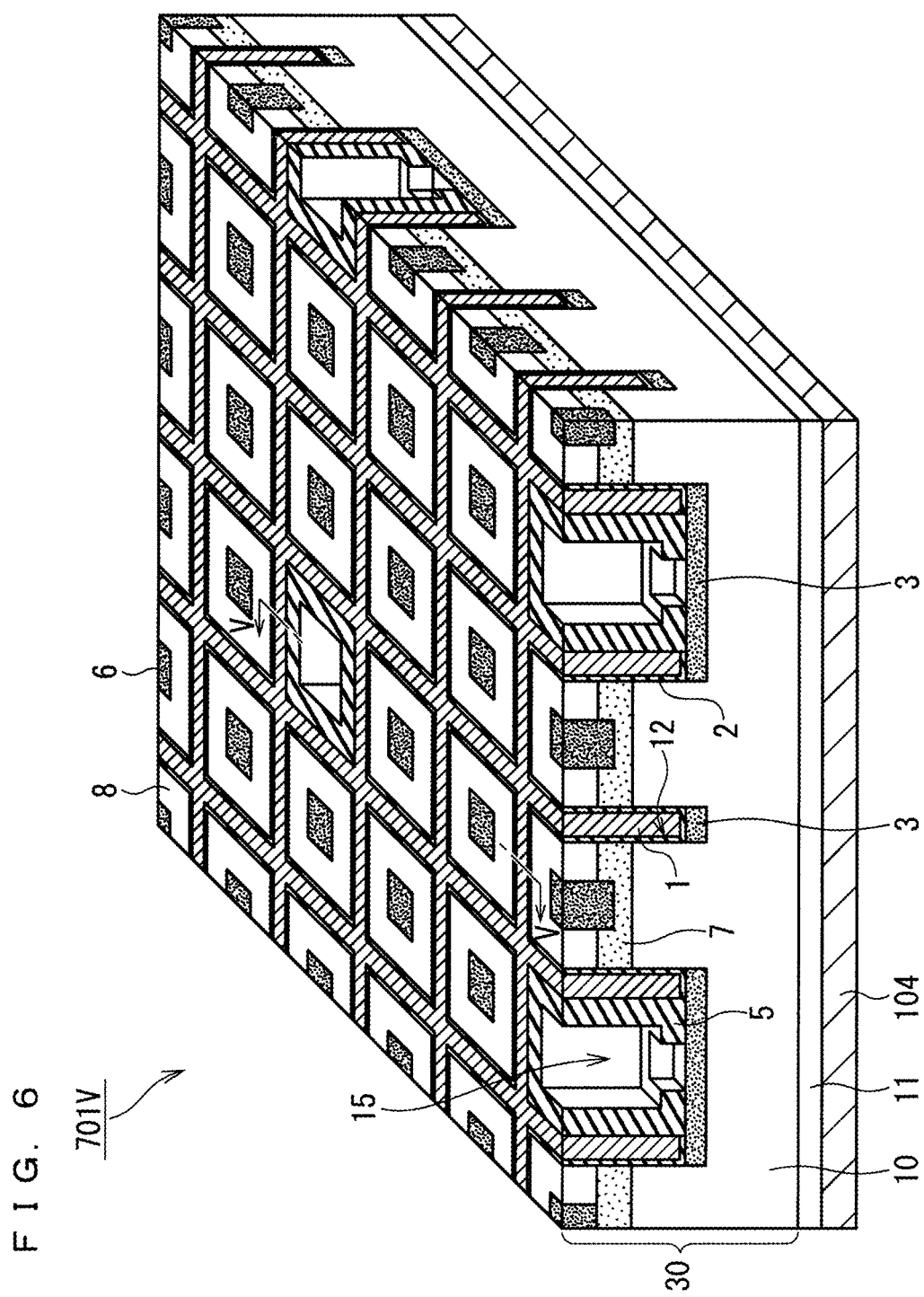
FIG. 6 is a partial cross-sectional perspective view schematically illustrating a configuration of the silicon carbide device according to the modification of the first embodiment of the present invention without a partial configuration on an upper surface side.

FIG. 5 is a partial cross-sectional view schematically illustrating a configuration of a MOSFET 701V (silicon carbide device) according to a modification of the first embodiment, taken along the line V-V of FIG. 6. FIG. 6 is a partial cross-sectional perspective view schematically illustrating a configuration of the MOSFET 701V without a partial configuration on an upper surface side.

In order to achieve electrical connection between the source pad electrode 4 and the first relaxation region 3, a p-type semiconductor region, such as the connection region 9, connects the source pad electrode 4 and the first relaxation region 3 to each other in the MOSFET 701 (FIG. 3). However, in this modification (FIG. 5), the source pad electrode 4 is in contact with the first relaxation region 3. Owing to this contact, ohmic junction or Schottky junction is provided between the source pad electrode 4 and the first relaxation region 3. This contact is achieved by a configuration in which a contact 15 that extends in the inter-layer insulation film 5 is provided in the source pad electrode 4 so as to reach the first relaxation region 3. The contact 15 may be disposed in a trench provided in the epitaxial layer 30. The trench may be disposed in the element region RE, and may be integrated with the first trench 12 as in the figure.

Note that a plurality of first relaxation regions 3 are separated from one another in the cross-section illustrated in FIG. 5, but these are connected to one another in the plane layout.

Second Embodiment

Figure 7:
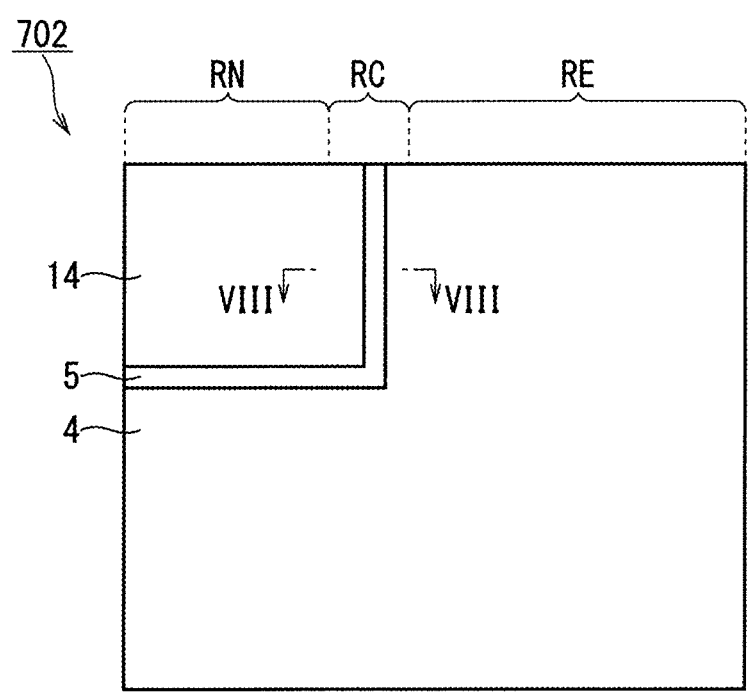
FIG. 7 is a plan view schematically illustrating a configuration of a silicon carbide device according to the second embodiment of the present invention.

FIG. 7 is a plan view schematically illustrating a configuration of a MOSFET 702 (silicon carbide semiconductor device) according to the second embodiment. In plan view, the MOSFET 702 includes a contact region RC between the element region RE and the non-element region RN.

FIG. 8 is a schematic partial cross-sectional view taken along the line VIII-VIII of FIG. 7. In the present embodiment, a third trench 212 is provided in the epitaxial layer 30 in at least a part of the contact region RC. The third trench 212 includes a side surface and a bottom surface. The third trench 212 may have depth the same as the depth of the first trench 12.

The MOSFET 702 includes a third relaxation region 203 disposed in the contact region RC. Specifically, the third relaxation region 203 is disposed below the third trench 212, and is in contact with the drift layer 10. Typically, the third relaxation region 203 is in contact with the bottom surface of the third trench 212. The third relaxation region 203 has the p type. The third relaxation region 203 may have acceptor concentration the same as the acceptor concentration of the first relaxation region 3. The third relaxation region 203 is electrically connected to the second relaxation region 103. Specifically, the third relaxation region 203 is separated from the second relaxation region 103 in the cross-section of FIG. 8, but is connected to the second relaxation region 103 in the plane layout. Note that it is preferable that the third relaxation region 203 be connected to the first relaxation region 3 in the plane layout, but the third relaxation region 203 need not be connected to the first relaxation region 3.

The third relaxation region 203 is electrically connected to the source pad electrode 4. In order to achieve this electrical connection, typically, in the third trench 212, the source pad electrode 4 includes a contact 215 that extends in the inter-layer insulation film 5 to reach the third relaxation region 203. With the contact 215 being in contact with the third relaxation region 203, the source pad electrode 4 and the third relaxation region 203 are joined by means of ohmic junction or Schottky junction. Note that the source pad electrode 4 may include a silicide in the junction part between the source pad electrode 4 and the third relaxation region 203.

The above configuration allows the second relaxation region 103 to be electrically connected to the source pad electrode 4. Specifically, the second relaxation region 103 having the p type is connected to the source pad electrode 4 through only the third relaxation region 203 having the p type.

Note that, in the third trench 212, a part of the gate electrode 1 and a part of the gate pad electrode 14 may be disposed to be in contact with each other. In this manner, electrical connection between the gate electrode 1 and the gate pad electrode 14 is achieved.

Configuration other than that described above is substantially the same as the configuration of the first embodiment described above, and thus the same or corresponding elements will be denoted by the same reference signs, and description thereof will not be repeated.

According to the present embodiment, the second relaxation region 103 is connected to the source pad electrode 4 through the third relaxation region 203. In this manner, a displacement current that flows in the second relaxation region 103 at the time of high-speed switching can be caused to sufficiently flow to the source pad electrode 4 or from the source pad electrode 4. Consequently, the magnitude of potential drop due to the displacement current is further reduced. Consequently, the magnitude of a voltage between a potential of the second relaxation region 103 and a gate potential due to the potential drop is further reduced. Consequently, dielectric breakdown between the second relaxation region 103 and a region including the gate potential, namely the gate pad electrode 14, is more securely reduced.

Note that the plane layout illustrated in FIG. 7 is only illustrative, and any disposition may be adopted for the non-element region RN in the plane layout. Further, the configuration for achieving electrical connection between the source pad electrode 4 and the second relaxation region 103 is not limited to the configuration illustrated in FIG. 8, and for example, these may be in contact with each other.

Third Embodiment

FIG. 9 is a partial cross-sectional view of a configuration of a MOSFET 703 (silicon carbide semiconductor device) according to the third embodiment, which is illustrated in a cross-section similar to that taken along the line VIII-VIII of FIG. 7. In plan view (see FIG. 7), between the element region RE and the non-element region RN, the MOSFET 703 includes a contact region RC in which a part of the impurity region 108 (FIG. 9) is disposed. In the contact region RC, the impurity region 108 and the source pad electrode 4 are electrically connected. In order to achieve this electrical connection, typically, in the contact region RC, the source pad electrode 4 includes a contact 115 that extends in the inter-layer insulation film 5 to reach the impurity region 108. With the contact 115 being in contact with the impurity region 108, ohmic junction or Schottky junction is provided between the source pad electrode 4 and the impurity region 108. In this manner, in the contact region RC, the impurity region 108 and the source pad electrode 4 are electrically connected. Note that, in the present embodiment, the contact 215 (FIG. 8: second embodiment) is not provided.

Configuration other than that described above is substantially the same as the configuration of the first or second embodiment described above, and thus the same or corresponding elements will be denoted by the same reference signs, and description thereof will not be repeated.

According to the present embodiment, the impurity region 108 is electrically connected to the source pad electrode 4. In this manner, a displacement current that flows in the impurity region 108 at the time of high-speed switching can be caused to sufficiently flow to the source pad electrode 4 or from the source pad electrode 4. Consequently, the magnitude of potential drop due to the displacement current is further reduced. Consequently, the magnitude of a voltage between a potential of the second relaxation region 103 and a gate potential due to the potential drop is further reduced. Consequently, dielectric breakdown between the second relaxation region 103 and a region including the gate potential, namely the gate pad electrode 14, is more securely reduced.

Fourth Embodiment

Figure 10:
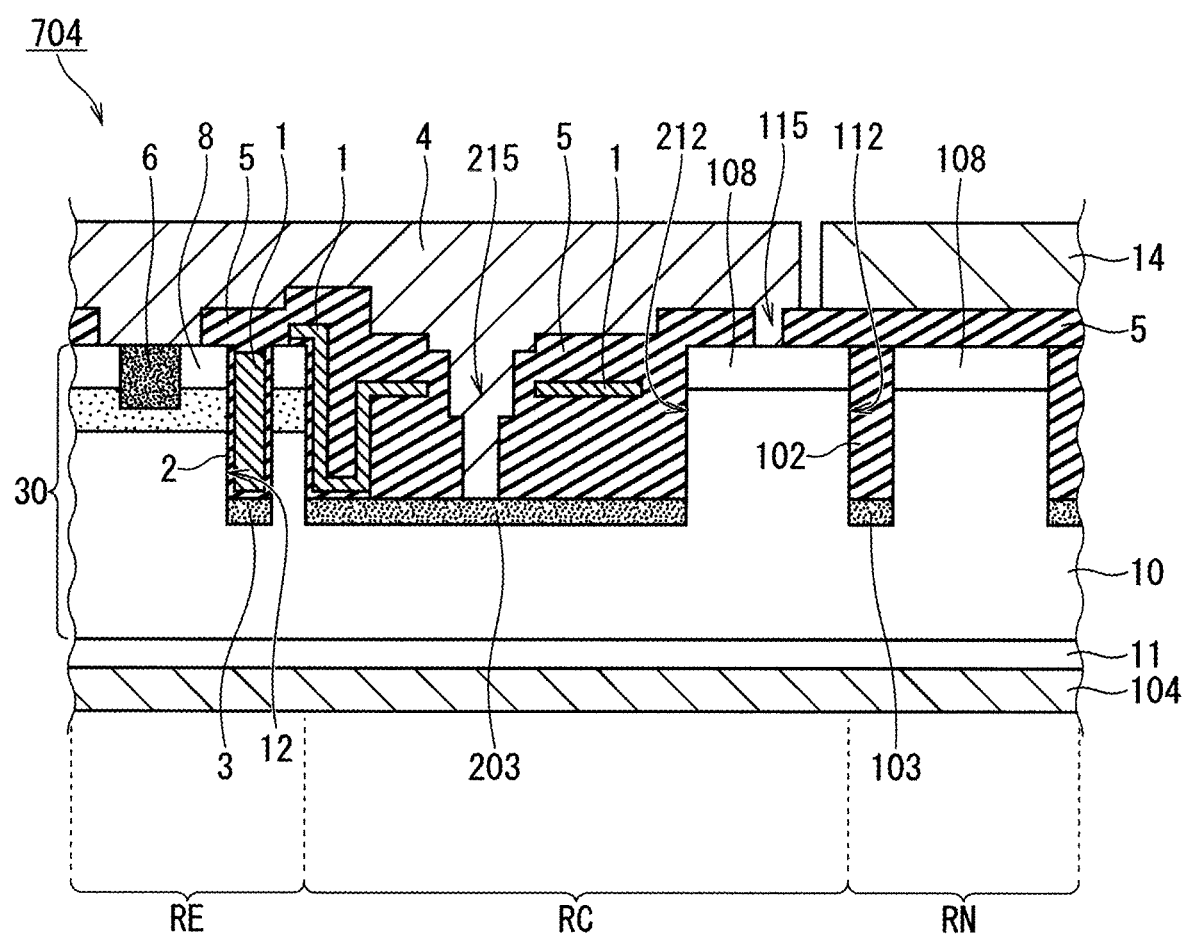
FIG. 10 is a partial cross-sectional view of a configuration of a silicon carbide device according to the fourth embodiment of the present invention, which is illustrated in a cross-section similar to that taken along the line VIII-VIII of FIG. 7.

FIG. 10 is a partial cross-sectional view of a configuration of a MOSFET 704 (silicon carbide semiconductor device) according to the fourth embodiment, which is illustrated in a cross-section similar to that taken along the line VIII-VIII of FIG. 7. In the MOSFET 704, both of the contact 215 described in the second embodiment and the contact 115 described in the third embodiment are provided. This configuration produces effects of both of the second and third embodiments.

Fifth Embodiment

FIG. 11 is a partial cross-sectional view illustrating a configuration of a MOSFET 705 (silicon carbide semiconductor device) according to the fifth embodiment in the non-element region RN. The MOSFET 705 includes, instead of the insulator region 102 (FIG. 4: first embodiment), an inner-surface insulation film 202 and a low-resistance region 101.

The inner-surface insulation film 202 is provided on the side surface and on the bottom surface of the second trench 112. A material of the inner-surface insulation film 202 may be the same material as the gate insulation film 2 (FIG. 2: first embodiment).

The low-resistance region 101 is provided in the second trench 112 through the inner-surface insulation film 202. The low-resistance region 101 is electrically insulated from the gate pad electrode 14 by the inter-layer insulation film 5. The low-resistance region 101 is made of metal or a doped semiconductor. In this manner, the low-resistance region 101 has low resistivity. A material of the low-resistance region 101 may be the same material as the gate electrode 1 (FIG. 2: first embodiment).

Note that configuration other than that described above is substantially the same as the configuration of the first to fourth embodiments described above, and thus the same or corresponding elements will be denoted by the same reference signs, and description thereof will not be repeated. The present embodiment also produces substantially the same effects as those of the first to fourth embodiments described above.

Sixth Embodiment

Figure 12:
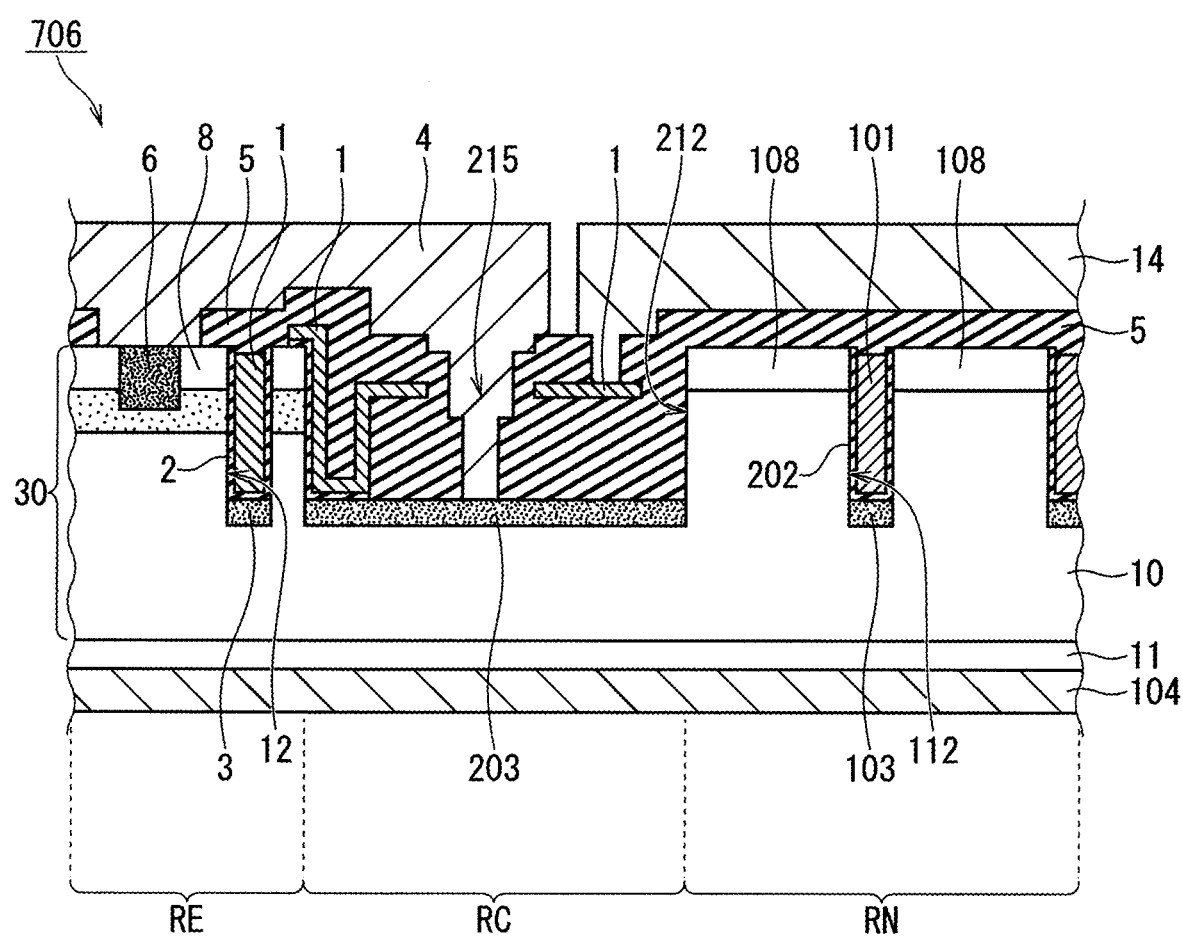
FIG. 12 is a partial cross-sectional view of a configuration of a silicon carbide device according to the sixth embodiment of the present invention, which is illustrated in a cross-section similar to that taken along the line VIII-VIII of FIG. 7.

FIG. 12 is a partial cross-sectional view of a configuration of a MOSFET 706 (silicon carbide device) according to the sixth embodiment, which is illustrated in a cross-section similar to that taken along the line VIII-VIII of FIG. 7. The MOSFET 706 includes a contact 215 similar to that of the second embodiment (FIG. 8), and includes an inner-surface insulation film 202 and a low-resistance region 101 similar to those of the fifth embodiment (FIG. 11).

Configuration other than that described above is substantially the same as the configuration of the first embodiment described above, and thus the same or corresponding elements will be denoted by the same reference signs, and description thereof will not be repeated. The present embodiment produces substantially the same effects as those of the second and fifth embodiments described above.

Seventh Embodiment

Figure 13:
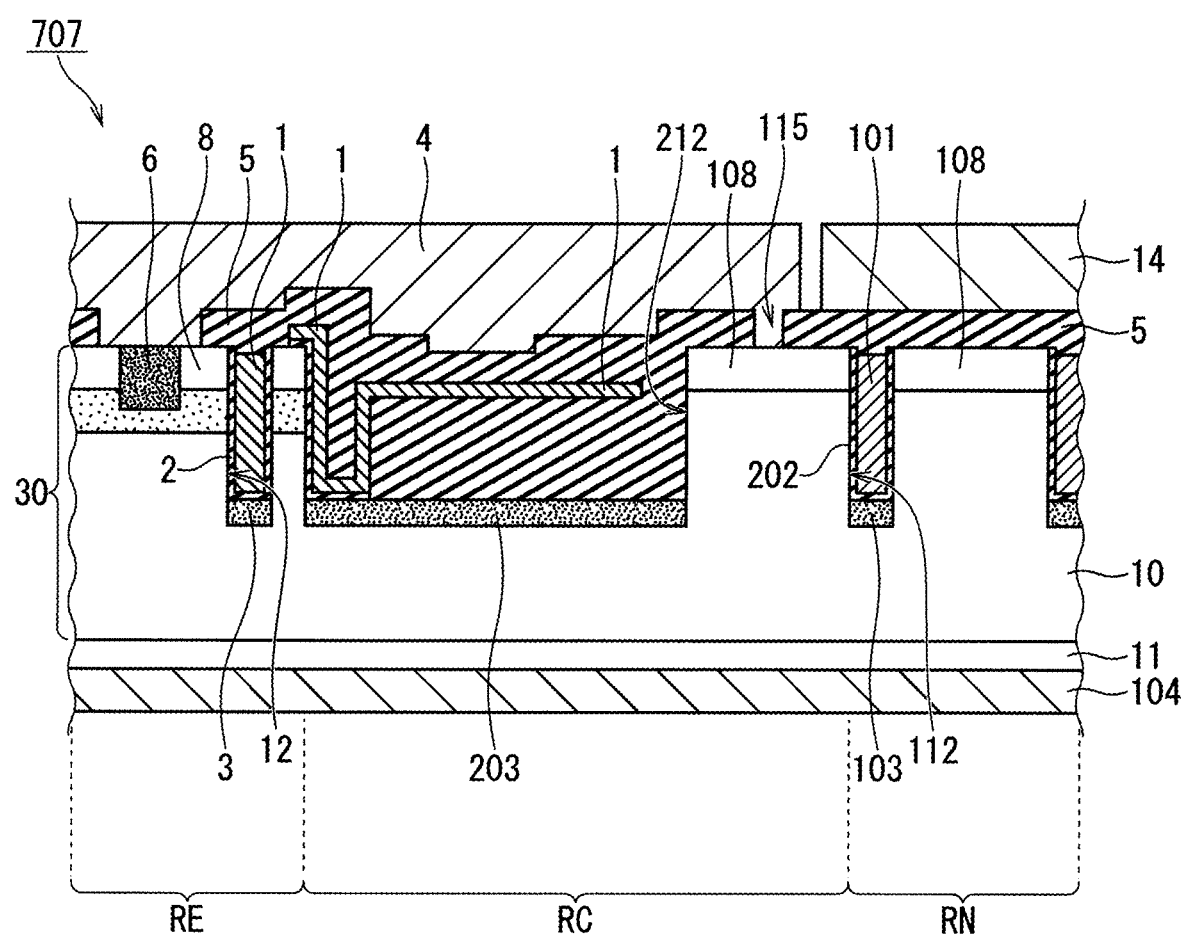
FIG. 13 is a partial cross-sectional view of a configuration of a silicon carbide device according to the seventh embodiment of the present invention, which is illustrated in a cross-section similar to that taken along the line VIII-VIII of FIG. 7.

FIG. 13 is a partial cross-sectional view of a configuration of a MOSFET 707 (silicon carbide device) according to the seventh embodiment, which is illustrated in a cross-section similar to that taken along the line VIII-VIII of FIG. 7. The MOSFET 707 includes a contact 115 similar to that of the third embodiment (FIG. 9), and includes an inner-surface insulation film 202 and a low-resistance region 101 similar to those of the fifth embodiment (FIG. 11).

Configuration other than that described above is substantially the same as the configuration of the first embodiment described above, and thus the same or corresponding elements will be denoted by the same reference signs, and description thereof will not be repeated. The present embodiment produces substantially the same effects as those of the third and fifth embodiments described above.

Eighth Embodiment

FIG. 14 is a partial cross-sectional view illustrating a configuration of a MOSFET 708 (silicon carbide semiconductor device) according to the eighth embodiment in the non-element region RN. The MOSFET 708 includes a connection region 109. The connection region 109 is provided adjacently to the side surface of the second trench 112, and is connected to the second relaxation region 103 and the impurity region 108. The connection region 109 has the p type, and preferably has acceptor concentration of $1\times10^{14}$ $cm^{-3}$ to $1\times10^{18}$ $cm^{-3}$. Note that, as illustrated in FIG. 11, the MOSFET 708 may include a cross-section in which the connection region 109 is not provided. Further, although the connection region 109 is provided on both the sides of the second trench 112 in FIG. 14, the connection region 109 may be provided on only either side thereof. Further, disposition of one connection region 109 provided on one side of the second trench 112 and disposition of another connection region 109 provided on the other side of the second trench 112 may be different in the longitudinal direction of the second trench 112. The acceptor concentration and thickness of the connection region 109 need not be uniform.

Note that configuration other than that described above is substantially the same as the configuration of the first to fourth embodiments described above, and thus the same or corresponding elements will be denoted by the same reference signs, and description thereof will not be repeated. Further, as a modification, the connection region 109 (FIG. 14) may be applied to the fifth to seventh embodiments (FIG. 11 to FIG. 13) including the inner-surface insulation film 202 and the low-resistance region 101.

According to the present embodiment, the connection region 109 is provided between the second relaxation region 103 and the impurity region 108. In this manner, a displacement current at the time of high-speed switching of the MOSFET 708 can be caused to effectively flow between the second relaxation region 103 and the impurity region 108. At the time of off-switching, a displacement current mainly flows due to a forward current in the pn junction between the connection region 109 and the impurity region 108, from the second relaxation region 103 to the impurity region 108 through the connection region 109. At the time of on-switching, a displacement current mainly flows through the pn junction capacitance between the connection region 109 and the impurity region 108, from the impurity region 108 to the second relaxation region 103 through the connection region 109. These displacement currents can flow with low potential drop owing to the provision of the connection region 109.

Ninth Embodiment

Figure 15:
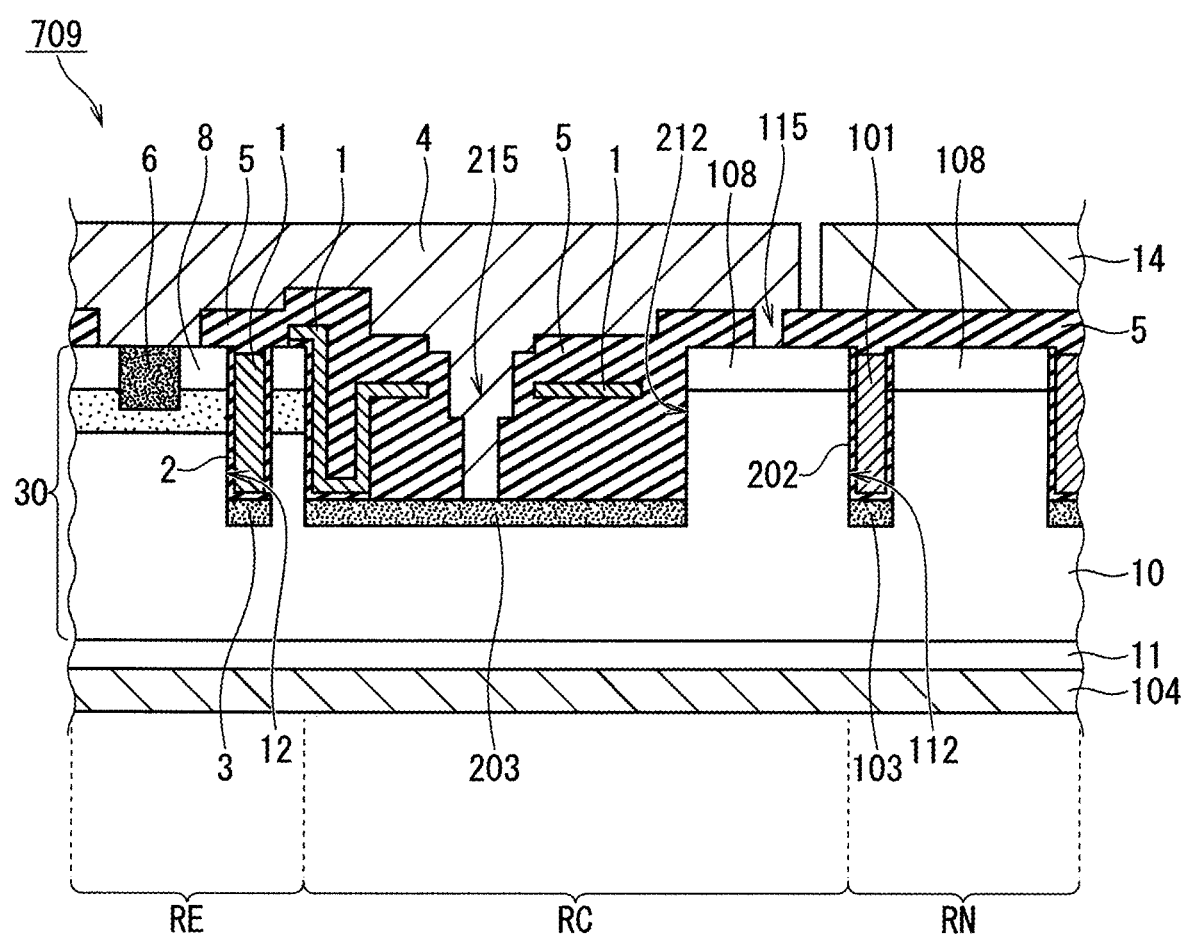
FIG. 15 is a partial cross-sectional view of a configuration of a silicon carbide device according to the ninth embodiment of the present invention, which is illustrated in a cross-section similar to that taken along the line VIII-VIII of FIG. 7.

FIG. 15 is a partial cross-sectional view of a configuration of a MOSFET 709 (silicon carbide device) according to the ninth embodiment, which is illustrated in a cross-section similar to that taken along the line VIII-VIII of FIG. 7. The MOSFET 709 includes a contact 115 and a contact 215 similar to those of the fourth embodiment (FIG. 10), and includes an inner-surface insulation film 202 and a low-resistance region 101 similar to those of the fifth embodiment (FIG. 11).

Configuration other than that described above is substantially the same as the configuration of the first embodiment described above, and thus the same or corresponding elements will be denoted by the same reference signs, and description thereof will not be repeated. The present embodiment produces substantially the same effects as those of the fourth and fifth embodiments described above.

Tenth Embodiment

Figure 16:
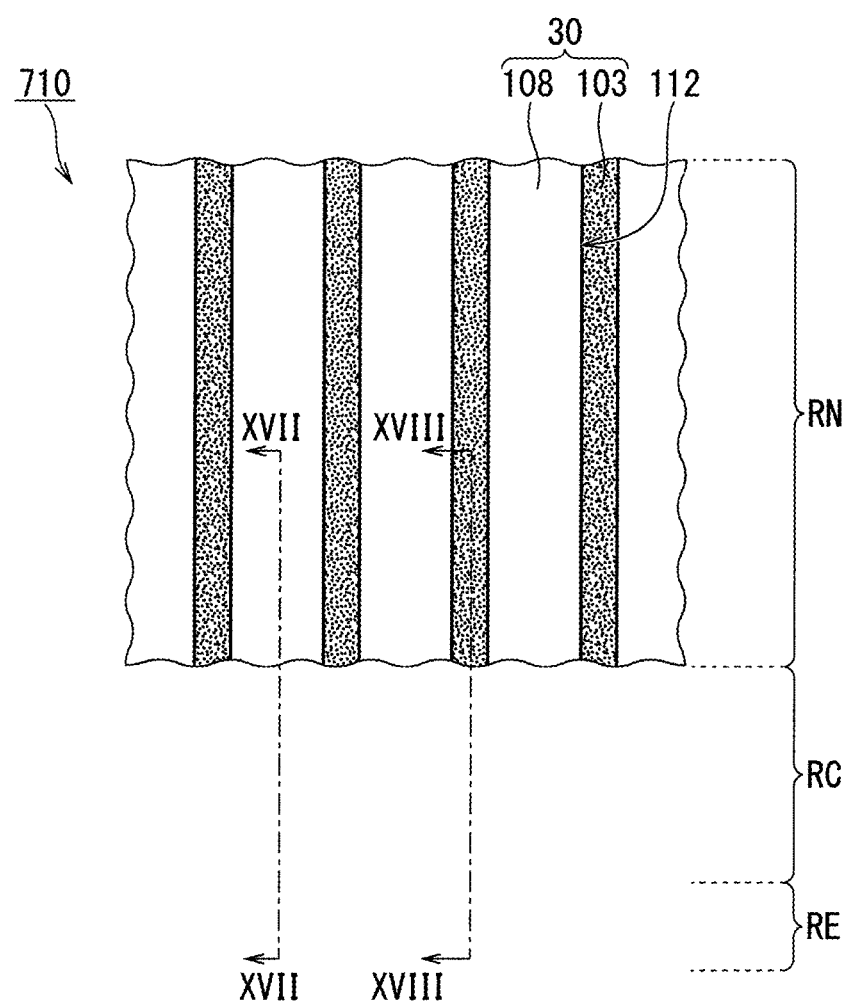
FIG. 16 is a partial plan view illustrating a configuration of a silicon carbide semiconductor layer of a silicon carbide device according to the tenth embodiment of the present invention in a non-element region.
Figure 18:
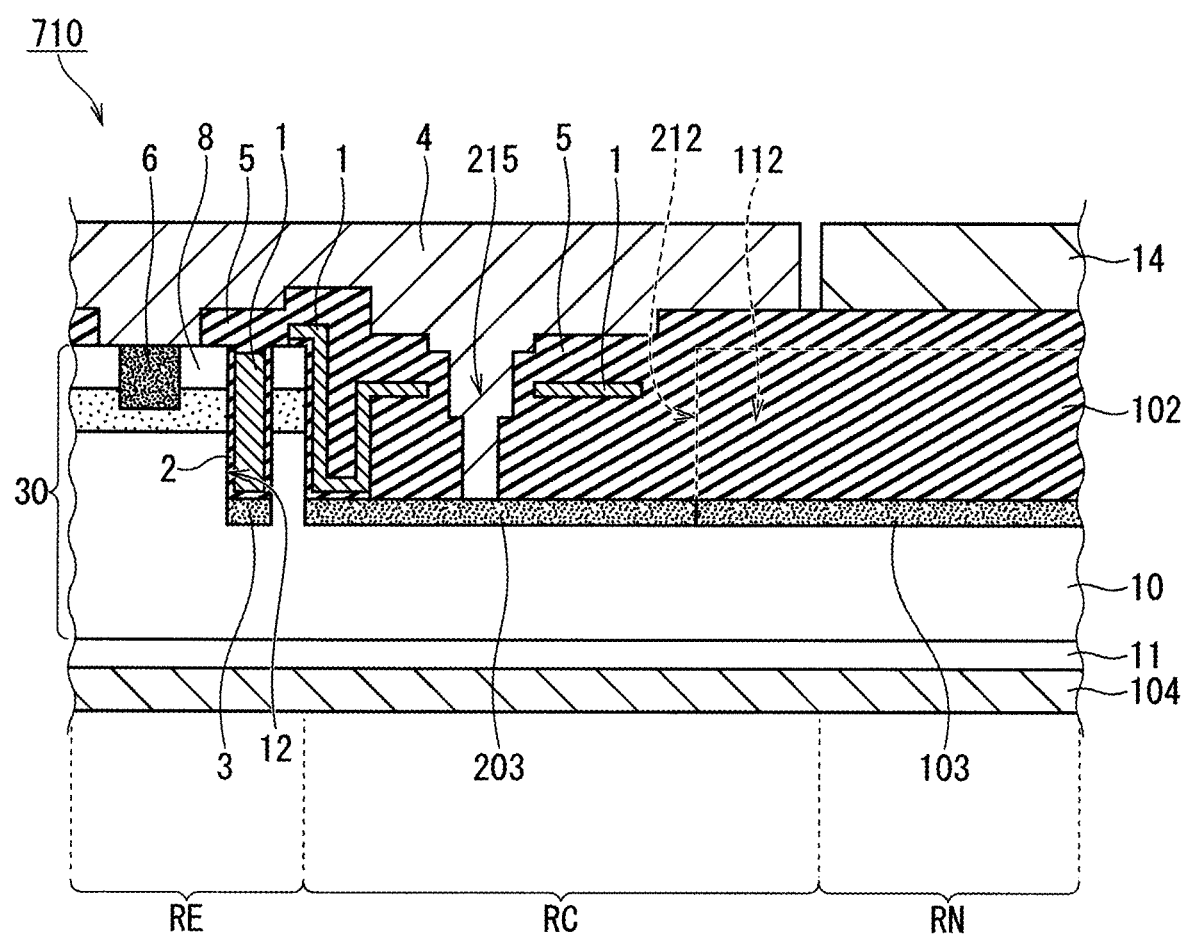
FIG. 18 is a partial cross-sectional view taken along the line XVIII-XVIII of FIG. 16.

FIG. 16 is a partial plan view illustrating a configuration of the epitaxial layer 30 of a MOSFET 710 (silicon carbide device) according to the tenth embodiment in the non-element region RN. FIG. 17 and FIG. 18 are partial cross-sectional views taken along the line XVII-XVII and the line XVIII-XVIII of FIG. 16, respectively.

In the present embodiment, a plurality of second trenches 112 are disposed at intervals. Specifically, in the figure, each of these extends in the vertical direction, and these are separated from one another in the horizontal direction. In the present embodiment, as illustrated in FIG. 18, such a plurality of parts are connected to the third trench 212. Owing to this configuration, the second relaxation region 103 is connected to the third relaxation region 203.

In the non-element region RN, each impurity region 108 (FIG. 16) is disposed between the second trenches 112. A plurality of impurity regions 108 are separated from one another. Each of these is electrically connected to the source pad electrode 4 by, for example, the contact 115 (FIG. 17). The contact 115 may continuously extend along the horizontal direction of FIG. 16 so as to extend across these, or may include a plurality of separate parts.

Each of the second relaxation regions 103 is disposed below the second trench 112, specifically, disposed on the bottom surface thereof. In this manner, the plurality of second relaxation regions 103 are separated from one another as illustrated in FIG. 16. In FIG. 16, each of these extends in the vertical direction, and these are separated from one another by the drift layer 10 (not illustrated in FIG. 16) in the horizontal direction immediately below the impurity region 108. Each of the second relaxation regions 103 is electrically connected to the source pad electrode 4 by, for example, the contact 215 (FIG. 18). The contact 215 may continuously extend along the horizontal direction of FIG. 16, or may include a plurality of separate parts.

Note that configuration other than that described above is substantially the same as the configuration of the first to fourth embodiments described above, and thus the same or corresponding elements will be denoted by the same reference signs, and description thereof will not be repeated. Further, as a modification, the configuration illustrated in the present embodiment may be applied to the fifth to seventh embodiments (FIG. 11 to FIG. 13) including the inner-surface insulation film 202 and the low-resistance region 101, instead of the insulator region 102.

According to the present embodiment, as illustrated in FIG. 16, a simple plane layout can be used as the plane layout of the non-element region RN. Specifically, line and space plane layout including an array in one direction (horizontal direction in FIG. 16) can be used. This allows for enhancement of reliability of the MOSFET.

Eleventh Embodiment

Figure 19:
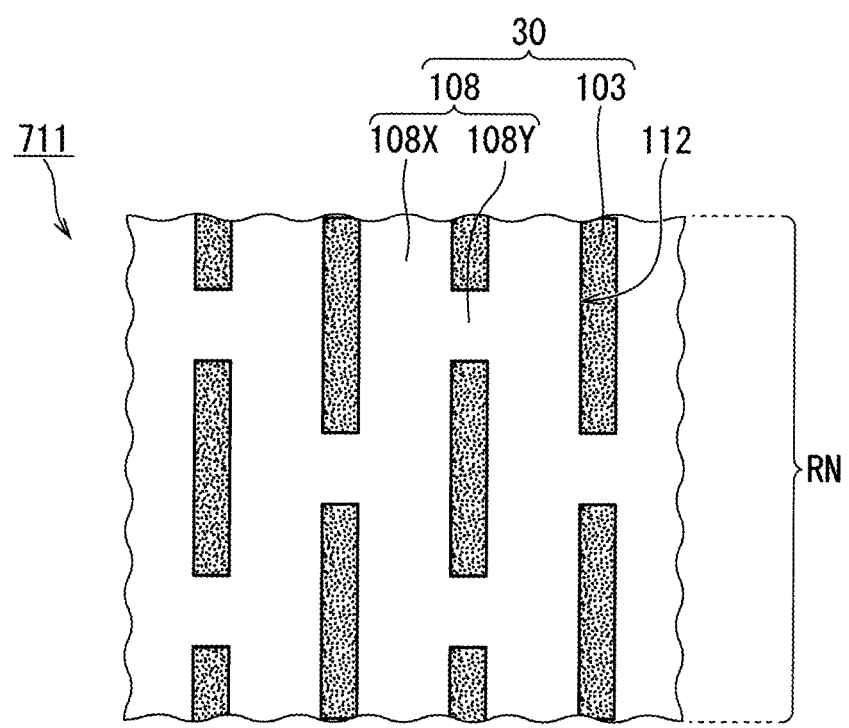
FIG. 19 is a partial plan view of a configuration of a silicon carbide semiconductor layer of a silicon carbide device according to the eleventh embodiment of the present invention in a non-element region, which is seen from a viewpoint similar to that of FIG. 16.

FIG. 19 is a partial plan view of a configuration of the epitaxial layer 30 of a MOSFET 711 (silicon carbide device) according to the eleventh embodiment in the non-element region RN, which is seen from a viewpoint similar to that of FIG. 16. In the MOSFET 711, the impurity region 108 includes a plurality of extending impurity regions 108X and at least one connection impurity region 108Y. The plurality of extending impurity regions 108X are separated from one another, and each of them extends in one direction (vertical direction in the figure). The connection impurity region 108Y connects adjacent ones of the plurality of extending impurity regions 108X to each other. Note that the connection impurity region 108Y may be provided in at least a part of adjacent pairs among the extending impurity regions 108X.

Configuration other than that described above is substantially the same as the configuration of the tenth embodiment or its modification described above, and thus the same or corresponding elements will be denoted by the same reference signs, and description thereof will not be repeated.

According to the present embodiment, the connection impurity region 108Y is provided in the impurity region 108 constituting a path for the displacement current as well as the second relaxation region 103. This reduces non-uniformity of distribution of a displacement current that flows in the second relaxation region 103 at the time of high-speed switching in the non-element region RN. Consequently, non-uniformity of distribution of the magnitude of potential drop along the second relaxation region 103 is reduced. Consequently, local increase of a voltage between the second relaxation region 103 and the gate pad electrode 14 due to the potential drop is reduced. Consequently, dielectric breakdown between the second relaxation region 103 and the gate pad electrode 14 is more securely reduced.

Twelfth Embodiment

Figure 20:
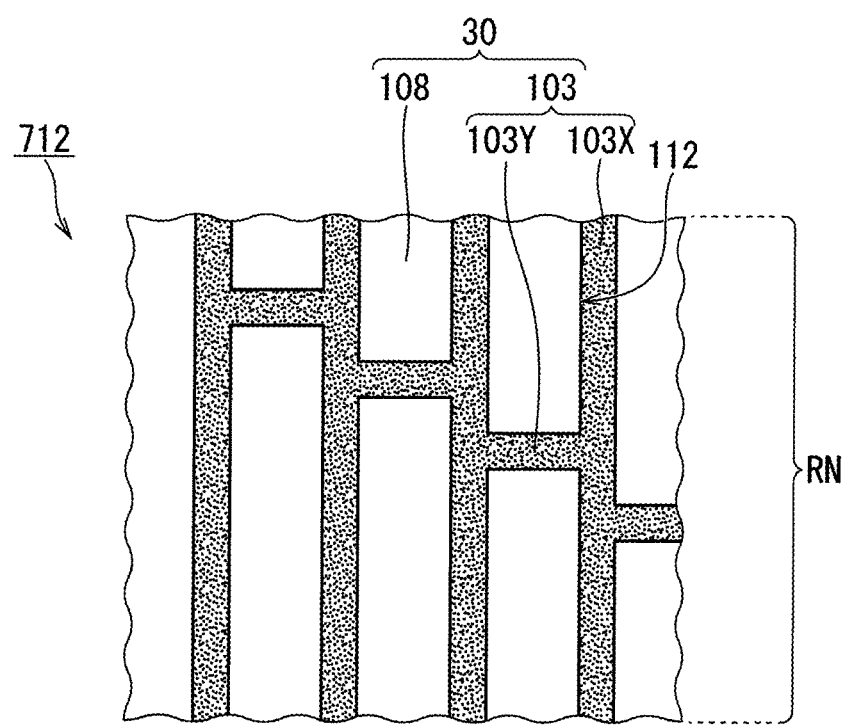
FIG. 20 is a partial plan view of a configuration of a silicon carbide semiconductor layer of a silicon carbide device according to the twelfth embodiment of the present invention in a non-element region, which is seen from a viewpoint similar to that of FIG. 16.

FIG. 20 is a partial plan view of a configuration of the epitaxial layer 30 of a MOSFET 712 (silicon carbide device) according to the twelfth embodiment in the non-element region RN, which is seen from a viewpoint similar to that of FIG. 16. In the MOSFET 712, the second relaxation region 103 includes a plurality of extending relaxation regions 103X and at least one connection relaxation region 103Y. The plurality of extending relaxation regions 103X are separated from one another, and each of them extends in one direction (vertical direction in the figure). The connection relaxation region 103Y connects adjacent ones of the plurality of extending relaxation regions 103X to each other. Note that the connection relaxation region 103Y may be provided in at least a part of adjacent pairs among the extending relaxation regions 103X.

Configuration other than that described above is substantially the same as the configuration of the tenth embodiment or its modification described above, and thus the same or corresponding elements will be denoted by the same reference signs, and description thereof will not be repeated.

According to the present embodiment, the connection relaxation region 103Y is provided in the second relaxation region 103. This reduces non-uniformity of distribution of a displacement current that flows in the second relaxation region 103 at the time of high-speed switching in the non-element region RN. Consequently, non-uniformity of distribution of the magnitude of potential drop along the second relaxation region 103 is reduced. Consequently, local increase of a voltage between the second relaxation region 103 and the gate pad electrode 14 due to the potential drop is reduced. Consequently, dielectric breakdown between the second relaxation region 103 and the gate pad electrode 14 is more securely reduced.

Thirteenth Embodiment

FIG. 21 is a partial cross-sectional view illustrating a configuration of a MOSFET 713 (silicon carbide device) according to the thirteenth embodiment in the non-element region RN. The MOSFET 713 includes a configuration in which an impurity region 107 having the p type is added to the configuration of the eighth embodiment (FIG. 14). The impurity region 107 is disposed on the drift layer 10, at a position immediately below the impurity region 108. In other words, in the present embodiment, the impurity region 108 is disposed above the drift layer 10, with the impurity region 107 being interposed between the impurity region 108 and the drift layer 10. The connection region 109 connects the second relaxation region 103 and the impurity region 107. It is preferable that the impurity region 107 have acceptor concentration of $1\times10^{14}$ cm$^{-3}$ to $1\times10^{18}$ cm$^{-3}$. Note that the acceptor concentration and thickness of the impurity region 107 need not be uniform.

Configuration other than that described above is substantially the same as the configuration of the first to fourth embodiments or the tenth to twelfth embodiments described above, and thus the same or corresponding elements will be denoted by the same reference signs, and description thereof will not be repeated. Further, as a modification, the impurity region 107 may be applied to the fifth to seventh embodiments (FIG. 11 to FIG. 13) including the inner-surface insulation film 202 and the low-resistance region 101, instead of the insulator region 102.

According to the present embodiment, owing to the provision of the impurity region 107, a displacement current at the time of high-speed switching of the MOSFET 713 can be caused to effectively flow between the second relaxation region 103 and the impurity region 108. At the time of off-switching, a displacement current mainly flows due to a forward current in the pn junction between the impurity region 107 and the impurity region 108, from the second relaxation region 103 to the impurity region 108 through the connection region 109 and the impurity region 107. At the time of on-switching, a displacement current mainly flows through the pn junction capacitance between the impurity region 107 and the impurity region 108, from the impurity region 108 to the second relaxation region 103 through the impurity region 107 and the connection region 109. These displacement currents can flow with low potential drop owing to the provision of the impurity region 107.

Fourteenth Embodiment (Configuration)

Figure 22:
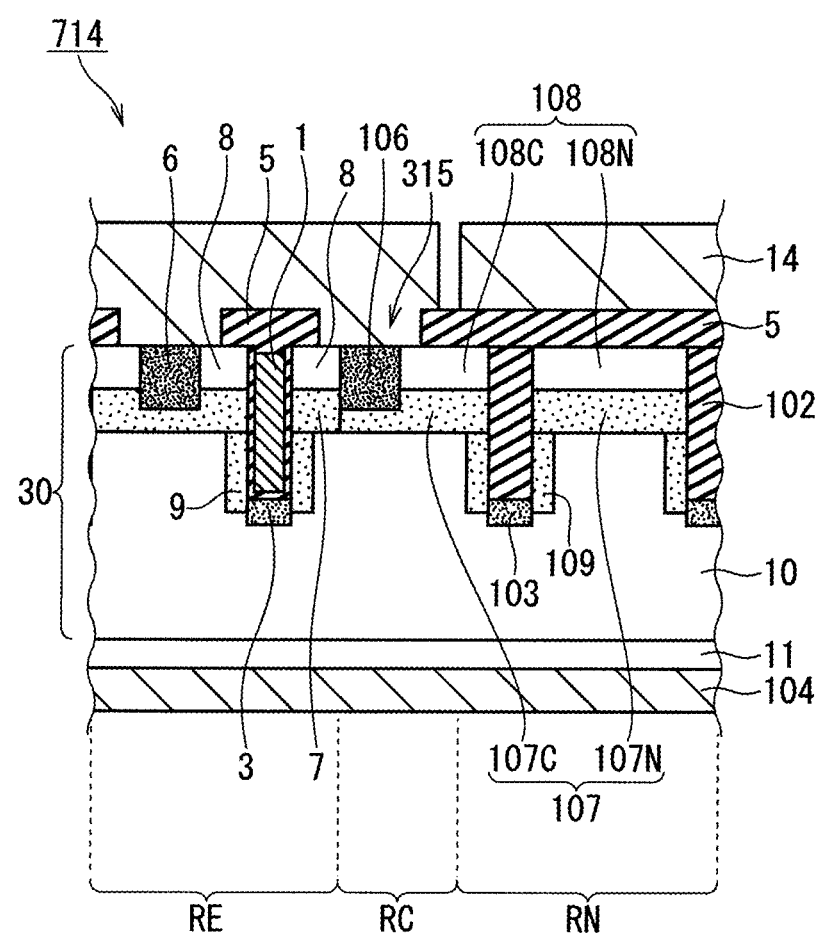
FIG. 22 is a partial cross-sectional view of a configuration of a silicon carbide device according to the fourteenth embodiment of the present invention, which is illustrated in a cross-section similar to that taken along the line VIII-VIII of FIG. 7.

FIG. 22 is a partial cross-sectional view of a configuration of a MOSFET 714 (silicon carbide device) according to the fourteenth embodiment, which is illustrated in a cross-section similar to that taken along the line VIII-VIII of FIG. 7.

In the MOSFET 714, the impurity region 108 includes a partial region 108N disposed in the non-element region RN and a partial region 108C disposed in the contact region RC. The partial region 108N and the partial region 108C are separated from each other in the cross-section of FIG. 22, but are connected to each another in the plane layout. The impurity region 107 includes a partial region 107N disposed in the non-element region RN and a partial region 107C disposed in the contact region RC. The partial region 107N and the partial region 107C are separated from each other in the cross-section of FIG. 22, but are connected to each another in the plane layout.

In the contact region RC, the epitaxial layer 30 includes a high-concentration region 106. The high-concentration region 106 penetrates the partial region 108C to reach the partial region 107C. The high-concentration region 106 has the p type, has acceptor concentration higher than the acceptor concentration of the impurity region 107, and specifically has acceptor concentration of $1\times10^{19}$ cm$^{-3}$ to $1\times10^{21}$ cm$^{-3}$. The acceptor concentration of the high-concentration region 106 may be the same as the acceptor concentration of the high-concentration region 6.

The partial region 108C is electrically connected to the source pad electrode 4. In order to achieve this electrical connection, typically, in the contact region RC, the source pad electrode 4 includes a contact 315 that extends in the inter-layer insulation film 5 to reach the partial region 108C. With the contact 315 being in contact with the partial region 108C, ohmic junction or Schottky junction is provided between the source pad electrode 4 and the partial region 108C. According to this structure, the source pad electrode 4 is connected to the partial region 108N through the partial region 108C. In this manner, the entire impurity region 108 is electrically connected to the source pad electrode 4.

The high-concentration region 106 is electrically connected to the source pad electrode 4. In order to achieve this electrical connection, typically, in the contact region RC, the source pad electrode 4 includes a contact 315 that extends in the inter-layer insulation film 5 to reach the high-concentration region 106. With the contact 315 being in contact with the high-concentration region 106, ohmic junction or Schottky junction is provided between the source pad electrode 4 and the high-concentration region 106. According to this structure, the source pad electrode 4 is connected to the second relaxation region 103 having the p type through the high-concentration region 106, the partial region 107C, and the connection region 109 each having the same p type. In this manner, the second relaxation region 103 is electrically connected to the source pad electrode 4.

Note that configuration other than that described above is substantially the same as the configuration of the thirteenth embodiment or its modification described above, and thus the same or corresponding elements will be denoted by the same reference signs, and description thereof will not be repeated.

(Effects)

According to the present embodiment, the source pad electrode 4 is electrically connected to the impurity region 108 and the second relaxation region 103. In this manner, a displacement current that flows in the second relaxation region 103 at the time of high-speed switching can be caused to sufficiently flow to the source pad electrode 4 or from the source pad electrode 4. Consequently, the magnitude of potential drop due to the displacement current is further reduced. Consequently, the magnitude of a voltage between a potential of the second relaxation region 103 and a gate potential due to the potential drop is further reduced. Consequently, dielectric breakdown between the second relaxation region 103 and a region including the gate potential, namely the gate pad electrode 14, is more securely reduced.

Specifically, the impurity region 108 is electrically connected to the source pad electrode 4. Thus, a displacement current that is generated in the impurity region 108 at the time of high-speed switching can easily flow to the source pad electrode 4 or from the source pad electrode 4. Further, the second relaxation region 103 is electrically connected to the source pad electrode 4. Thus, a displacement current that is generated in the second relaxation region 103 at the time of high-speed switching can easily flow to the source pad electrode 4 or from the source pad electrode 4.

Note that, in the present invention, each of the embodiments can be freely combined, and each of the embodiments can be modified or omitted as appropriate within the scope of the invention. While the invention has been shown and described in detail, the foregoing description is in all aspects illustrative and not restrictive. It is therefore understood that numerous unillustrated modifications can be devised without departing from the scope of the invention.

EXPLANATION OF REFERENCE SIGNS

RC contact region, RE element region, RN non-element region, 1 gate electrode, 2 gate insulation film, 3 first relaxation region, 4 source pad electrode, 5 inter-layer insulation film, 6, 106 high-concentration region, 7 base region, 8 source region, 109 connection region, 10 drift layer, 11 substrate (silicon carbide semiconductor substrate), 12 first trench, 14 gate pad electrode, 30 epitaxial layer, 101 low-resistance region, 102 insulator region, 103 second relaxation region, 104 drain electrode, 107 impurity region, 112 second trench, 202 inner-surface insulation film, 203 third relaxation region, 212 third trench, 701-714, 701V MOSFET (silicon carbide semiconductor device).

The invention claimed is:

1. A silicon carbide semiconductor device including an element region and a non-element region being provided outside the element region in plan view, the silicon carbide semiconductor device comprising:
    a silicon carbide semiconductor substrate extending across the element region and the non-element region;
    a drift layer being provided on the silicon carbide semiconductor substrate, being made of silicon carbide, and having a first conductivity type;
    a base region being disposed in the element region, being provided on the drift layer, and having a second conductivity type different from the first conductivity type;
    a source region being disposed in the element region, being provided on the base region, and having the first conductivity type;
    a first trench having a side surface penetrating the source region and the base region, and a bottom surface;
    a gate insulation film being provided on the side surface and on the bottom surface of the first trench;
    a gate electrode being provided in the first trench through the gate insulation film;
    a first relaxation region being disposed below the first trench, being in contact with the drift layer, and having the second conductivity type;
    a source pad electrode being electrically connected to the source region and the first relaxation region;
    a gate pad electrode being disposed in the non-element region, and being electrically connected to the gate electrode;
    at least one impurity region being disposed under the gate pad electrode in at least the non-element region, being provided on the drift layer under the gate pad electrode, having the first conductivity type, and having a higher impurity concentration of the first conductivity type than an impurity concentration of the first conductivity type of the drift layer;
    at least one second trench having a side surface penetrating the at least one impurity region, and a bottom surface; and
    at least one second relaxation region being disposed below the at least one second trench, being in contact with the drift layer, and having the second conductivity type, wherein
    in plan view, between the element region and the non-element region, the silicon carbide semiconductor device includes a contact region in which a part of the at least one impurity region is disposed and in which a third trench is provided, and in the contact region, the at least one impurity region and the source pad electrode are electrically connected, and
    the silicon carbide semiconductor device further comprises a third relaxation region being disposed below the third trench, being electrically connected to each of the source pad electrode and the at least one second relaxation region, and having the second conductivity type,
    wherein the element region is a region in which a cell that actually functions as a transistor is disposed, and the non-element region is a region in which the gate pad electrode for supplying the gate electrode with a desired voltage from outside is disposed.

2. The silicon carbide semiconductor device according to claim 1, wherein
    the at least one second trench is filled with an insulator.

3. The silicon carbide semiconductor device according to claim 1, further comprising:
an inner-surface insulation film being provided on the side surface and on the bottom surface of the at least one second trench; and
a low-resistance region being provided in the at least one second trench through the inner-surface insulation film, being electrically insulated from the gate pad electrode, and being made of metal or a doped semiconductor.

4. The silicon carbide semiconductor device according to claim 1, further comprising
a connection region being provided on the side surface of the at least one second trench, having the second conductivity type, and connecting the at least one second relaxation region and the at least one impurity region to each other.

5. The silicon carbide semiconductor device according to claim 1, wherein
the at least one second relaxation region includes a plurality of second relaxation regions, and the plurality of second relaxation regions are provided to be separated from one another, and
the at least one impurity region includes a plurality of impurity regions, and the plurality of impurity regions are provided to be separated from one another.

6. The silicon carbide semiconductor device according to claim 1, wherein
the at least one second relaxation region includes a plurality of second relaxation regions, and the plurality of second relaxation regions are provided to be separated from one another, and
the at least one impurity region includes a plurality of extending impurity regions being separated from one another, and a connection impurity region connecting adjacent ones of the plurality of extending impurity regions to each other.

7. The silicon carbide semiconductor device according to claim 1, wherein
the at least one impurity region includes a plurality of impurity regions, and the plurality of impurity regions are provided to be separated from one another, and
the at least one second relaxation region includes a plurality of extending relaxation regions being separated from one another, and a connection relaxation region connecting adjacent ones of the plurality of extending relaxation regions to each other.

8. The silicon carbide semiconductor device according to claim 1, wherein
the first trench and the at least one second trench have same depth.

9. The silicon carbide semiconductor device according to claim 1, wherein
the at least one second trench includes a plurality of second trenches, and the plurality of second trenches are provided in the non-element region.

* * * * *